(12) United States Patent
Doornbos et al.

(10) Patent No.: US 10,170,378 B2
(45) Date of Patent: Jan. 1, 2019

(54) GATE ALL-AROUND SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Gerben Doornbos, Leuven (BE); Chung-Te Lin, Tainan (TW); Mark Van Dal, Linden (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/498,748

(22) Filed: Apr. 27, 2017

(65) Prior Publication Data

US 2018/0151452 A1   May 31, 2018

Related U.S. Application Data

(60) Provisional application No. 62/427,381, filed on Nov. 29, 2016.

(51) Int. Cl.
*H01L 29/423* (2006.01)
*H01L 21/84* (2006.01)
(Continued)

(52) U.S. Cl.
CPC ........ *H01L 21/845* (2013.01); *H01L 27/1211* (2013.01); *H01L 29/42392* (2013.01);
(Continued)

(58) Field of Classification Search
CPC ......... H01L 29/42392; H01L 21/02603; H01L 29/66545; H01L 29/0673; H01L 29/66795;
(Continued)

(56) References Cited

U.S. PATENT DOCUMENTS 8,823,102 B2   9/2014  van Dal et al.
9,209,247 B2   12/2015 Colinge et al.
(Continued)

OTHER PUBLICATIONS

J.J. Gu et al., "III-V Gate-all-around Nanowire MOSFET Process Technology: From 3D to 4D", School of Electrical and Computer Engineering and Birck Nanotechnology Center, Purdue University et al., IEEE 2012, pp. 23.7.1-23.7.4.
(Continued)

*Primary Examiner* — Khiem D Nguyen
(74) *Attorney, Agent, or Firm* — McDermott Will & Emery LLP

(57) ABSTRACT

Semiconductor device includes first and second nanowire structures disposed on semiconductor substrate extending in first direction on substrate. First nanowire structure includes plurality of first nanowires including first nanowire material extending along first direction and arranged in second direction, second direction substantially perpendicular to first direction. Second nanowire structure includes plurality of second nanowires including second nanowire material extending along first direction arranged in second direction. Second nanowire material is not same as first nanowire material. Each nanowire is spaced-apart from immediately adjacent nanowire. First and second gate structures wrap around first and second nanowires at first region of respective first and second nanowire structures. First and second gate structures include gate electrodes. Viewed in cross section taken along third direction substantially perpendicular to first and second directions, height of first nanowires along second direction is not equal to distance of spacing along second direction between immediately adjacent second nanowires.

20 Claims, 20 Drawing Sheets

(51) Int. Cl.
*H01L 27/12* (2006.01)
*H01L 29/06* (2006.01)
*H01L 29/66* (2006.01)
*H01L 29/78* (2006.01)

(52) U.S. Cl.
CPC ...... *H01L 29/0673* (2013.01); *H01L 29/6681* (2013.01); *H01L 29/7853* (2013.01)

(58) Field of Classification Search
CPC ............. H01L 29/785; H01L 29/78696; H01L 21/30604; H01L 21/02532
See application file for complete search history.

(56) References Cited

U.S. PATENT DOCUMENTS

| | | | |
|---|---|---|---|
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxford | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,748,404 B1* | 8/2017 | Chang | H01L 29/78696 |
| 2016/0079394 A1* | 3/2016 | Li | H01L 29/66795 257/347 |
| 2017/0140933 A1* | 5/2017 | Lee | H01L 29/0649 |

OTHER PUBLICATIONS

T. Ernst et al., "Novel 3D integration process for highly scalable Nano-Beam stacked-channels GAA (NBG) FinFETs with HfO2/TiN gate stack", Cea-Leti et al., 4 pages.
Sung-Young Lee et al., "A Novel Sub-50 nm Multi-Bridge-Channel MOSFET (MBCFET) with Extremely High Performance", 2004 Symposium on VLSI Technology Digest of Technical Papers, pp. 200-201.
V. Loup et al., "Silicon and SiGe Alloys Wet Etching Using TMAH Chemistry", The Electrochemical Society, ECS Transactions, vol. 58, No. 6, (2013), pp. 47-55.
M. Orlowski et al., Si, SiGe, Ge, and III-V Semiconductor Nanomembranes and Nanowires Enabled by SiGe Epitaxy, The Electrochemical Society, ECS Transactions, vol. 33, No. 6, (2010), pp. 777-789.
T. Salvetat et al., "Comparison Between Three Si1—xGex versus Si Selective Etching Processes", The Electrochemical Society, ECS Transactions, vol. 16, No. 10, (2008), pp. 439-449.
Sung-Gi Hur et al., "A Practical Si Nanowire Technology with Nanowire-on-Insulator structure for beyond 10nm Logic Technologies", Samsung Electronics Co., Ltd., IEEE 2013, pp. 26.5.1-26.5.4.

\* cited by examiner

GATE ALL-AROUND SEMICONDUCTOR DEVICE AND MANUFACTURING METHOD THEREOF

CROSS-REFERENCE TO RELATED APPLICATIONS

This application claims priority to U.S. Provisional Patent Application 62/427,381 filed Nov. 29, 2016, the entire disclosure of which is incorporated herein by reference.

TECHNICAL FIELD

The disclosure relates to semiconductor integrated circuits, and more particularly to semiconductor devices having gate-all-around structures and their manufacturing processes.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET) including a fin FET (FinFET) and a gate-all-around (GAA) FET. In a FinFET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, the four side surfaces of the channel region are surrounded by the gate electrode, which allows for fuller depletion in the channel region and results in less short-channel effects, such as steeper sub-threshold current swing (SS) and smaller drain induced barrier lowering (DIBL).

As transistor dimensions are continually scaled down to sub 20-25 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
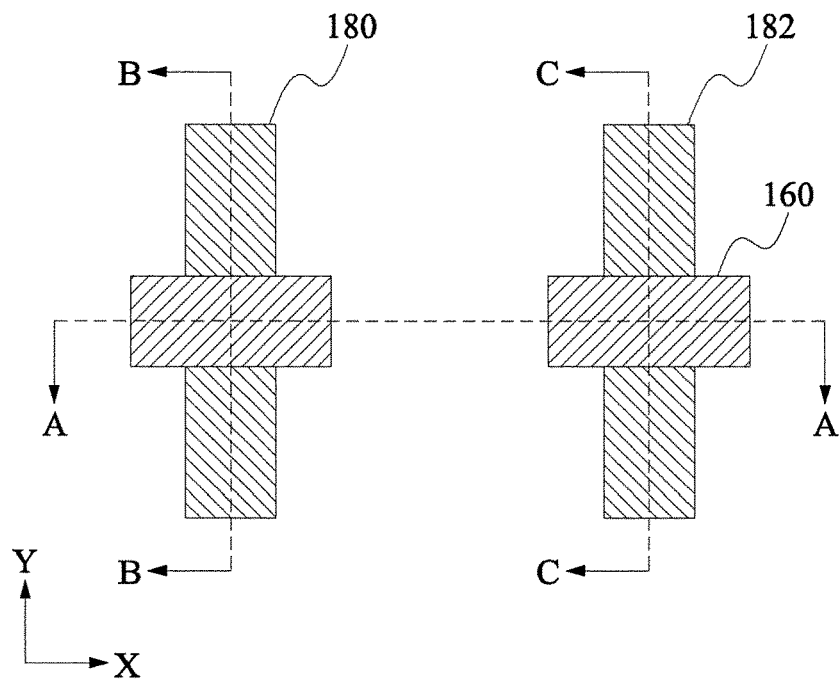
FIG. 1 is a plan view of an embodiment of a GAA FET device according to the present disclosure.

FIG. 1 is a plan view of an embodiment of a GAA FET device according to the present disclosure.

FIGS. 2-7 show exemplary sequential processes for manufacturing GAA FET devices according to embodiments of the present disclosure. It is understood that additional operations can be provided before, during, and after processes shown by FIGS. 2-7, and some of the operations described below can be replaced or eliminated, for certain embodiments of the method. The order of the operations/processes may be interchangeable.

A plan view of a GAA FET device is illustrated in FIG. 1. As shown in FIG. 1, gate electrode structures 160 are formed overlying first and second nanowire structures 180 and 182, each of which include one or more nanowires. Although two nanowire structures and two gate structures are shown in FIG. 1, GAA FET devices according to the present disclosure may include one, three, or more nanowire structures and one, three, or more gate electrode structures.

Figure 2:
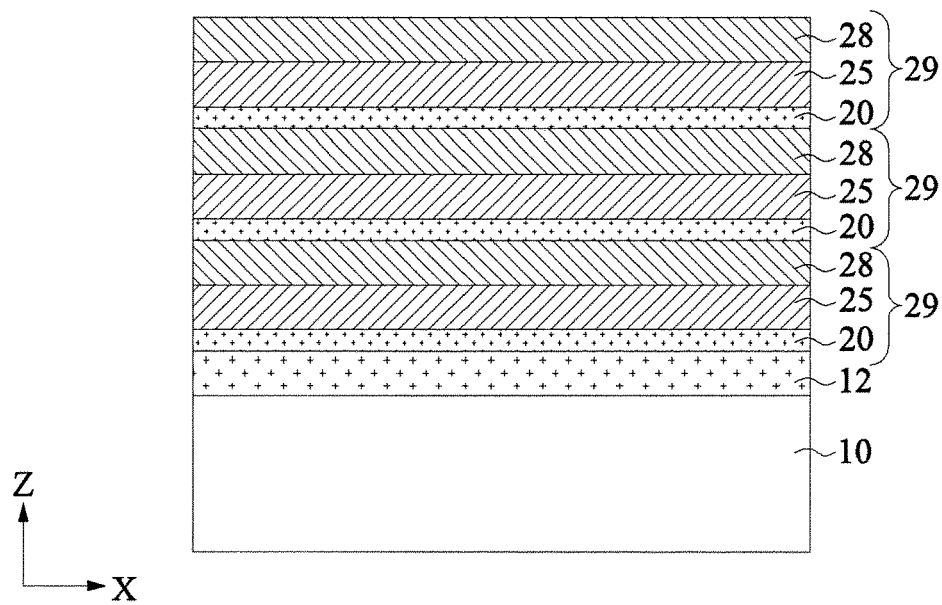
FIG. 2 shows a sequential process for manufacturing a GAA FET device according to an embodiment of the present disclosure.

As shown in FIG. 2, stacked semiconductor layers are formed over a substrate 10. The stacked semiconductor layers include first semiconductor layers 20, second semiconductor layers 25, and third semiconductor layers 28. FIG. 2 corresponds to a cross-section view taken along line A-A of FIG. 1.

In one embodiment, substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb, InP, or any combination thereof. In a certain embodiment, the substrate 10 is made of Si.

The substrate 10 may include in its surface region, one or more strain-relaxed buffer layers 12. The strain-relaxed buffer layers 12 can serve to gradually change the lattice constant from that of the substrate to that of the overlying semiconductor layers to prevent defects from forming in the overlying semiconductor layers. The strain-relaxed buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, InP, or any combination thereof. In particular embodiments, a silicon germanium (SiGe) strain-relaxed buffer layer 12 is epitaxially grown to a thickness of about 50 nm to about 150 nm on the silicon substrate 10. In other embodiments, the thickness of the strain-relaxed buffer layer 12 ranges from about 80 to about 120 nm. The germanium concentration of the SiGe buffer layers may increase from 20 atomic % for the bottom-most buffer layer to 80 atomic % for the top-most buffer layer.

Figure 3:
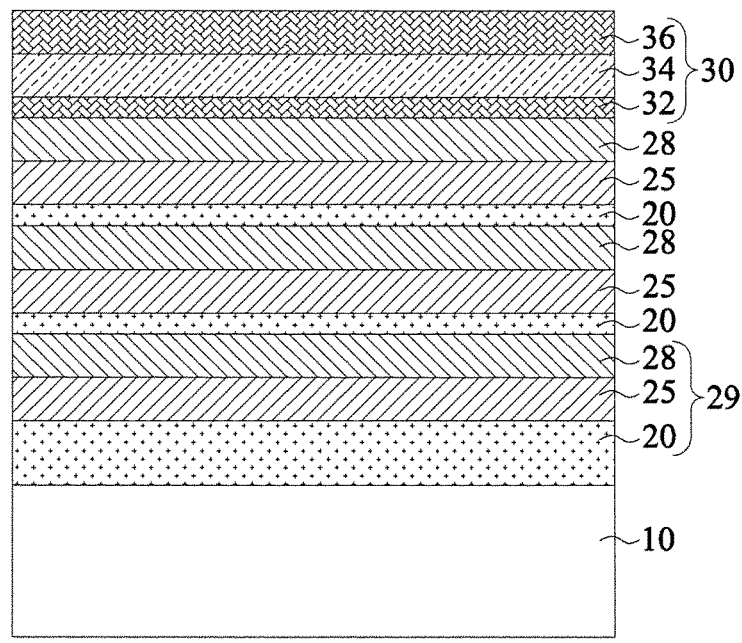
FIG. 3 shows a sequential process performed on the device of FIG. 2 for manufacturing a GAA FET device according to an embodiment of the present disclosure.

In certain embodiments, a first semiconductor layer 20 is formed on the optional strain-relaxed buffer layer 12. In other embodiments, with no strain-relaxed buffer layer, the first (bottom-most) first semiconductor layer 20 formed on the substrate 10 is thicker than first semiconductor layer 20 formed on the strain-relaxed buffer layer 12, as shown in FIG. 3.

The first semiconductor layers 20, second semiconductor layers 25, and third semiconductor layers 28 are made of different materials, including materials having different lattice constants, and may include one or more layers of such as, but not limited to, Si, Ge, SiGe, GaAs, InSb, GaP, GaSb, InAlAs, InGaAs, GaSbP, GaAsSb, and InP. In some embodiments, the first semiconductor layers 20, the second semiconductor layers 25, and the third semiconductor layers 28 are made of Si, a Si compound, SiGe, Ge, or a Ge compound. In some embodiments, the first semiconductor layer 20 is SiGe, the second semiconductor layer 25 is SiGe, and the third semiconductor layer 28 is Ge. The SiGe in the first semiconductor layer 20 may be $Si_{1-x}Ge_x$, where $0.2 \leq x \leq 0.8$. In this disclosure, an "M" compound" or an "M based compound" means the majority of the compound is M. In other embodiments, the second semiconductor layer 25 is $Si_{1-y}Ge_y$, the third semiconductor layer 28 is $Si_{1-z}Ge_z$, and the first semiconductor layer 20 is $Si_{1-x}Ge_x$, where $0<z<x<y<1$, where $0.2 \leq x \leq 0.8$.

In certain embodiments, the first, second, and third semiconductor layers 20, 25, and 28 are doped with up to $2\times10^{20}$ dopants/cm$^3$. The dopants can be n-type or p-type semiconductor dopants, including As, Sb, P, B, Ga, and Al.

From the top of the substrate 10 or the optional strain-relaxed buffer layer 12 the semiconductor layers are periodically stacked as first semiconductor layer 20, second semiconductor layer 25, and third semiconductor layer 28 in some embodiments. This period 29 is repeated twice to provide 3 periods 29, as shown in FIG. 2. The number of periods 29 in a stack can range from 2 to 10 periods, or more. In certain embodiments, the number of periods 29 ranges from 4 to 6 periods. By adjusting the numbers of the stacked layers, a driving current of the GAA FET device can be adjusted.

The first semiconductor layers 20, second semiconductor layers 25, and third semiconductor layers 28 are epitaxially formed over the substrate 10. The thickness of each of the second semiconductor layers 25 may be equal to each other, and is in a range from about 3 nm to about 15 nm in some embodiments. In certain embodiments, the thickness of each of the second semiconductor layers 25 are in a range from about 5 nm to about 7 nm.

In certain embodiments, the thicknesses of the first semiconductor layers 20 are in a range from about 2 nm to about 10 nm in some embodiments. In certain embodiments, the thickness of the first semiconductor layers 20 ranges from about 3 nm to about 5 nm.

The thicknesses of the third semiconductor layers 28 are in a range from about 3 nm to about 15 nm in some embodiments. In certain embodiments, the thickness of the third semiconductor layers 28 ranges from about 5 nm to about 7 nm.

In certain embodiments, the thickness of the second and third semiconductor layers 25 and 28 are about the same and the thickness of the first semiconductor layer 20 is less than the thickness of the second and third semiconductor layers 25 and 28.

The first, second, and third semiconductor layers 20, 25, and 28 may be formed by chemical vapor deposition (CVD), including metal-organic CVD (MOCVD), low pressure CVD (LPCVD) and plasma enhanced CVD (PECVD), physical vapor deposition (PVD), molecular beam epitaxy (MBE), atomic layer deposition (ALD), or other suitable processes.

Figure 4:
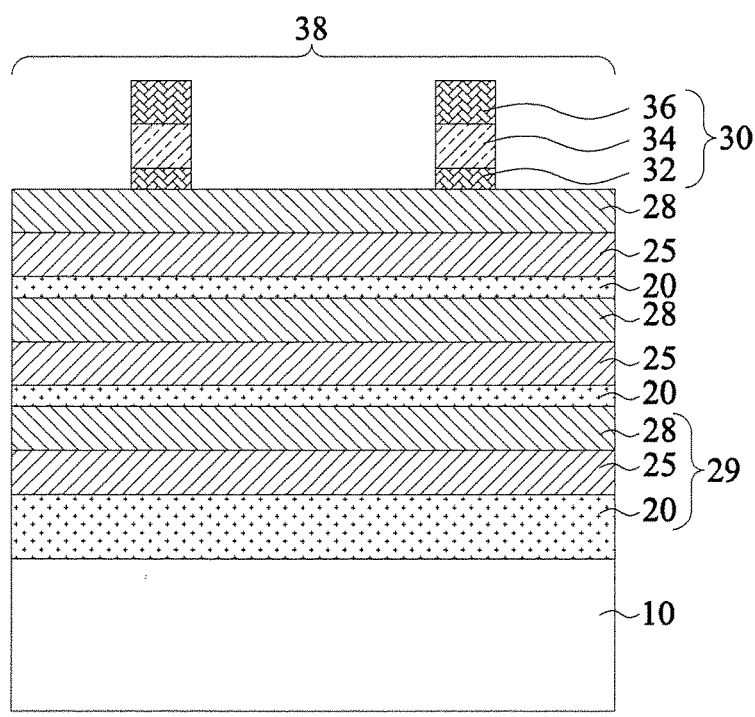
FIG. 4 shows a sequential process performed on the device of FIG. 3 for manufacturing a GAA FET device according to an embodiment of the present disclosure.

Next, as shown in FIG. 3 a mask layer 30 is formed over the stacked layers in some embodiments. In some embodiments, the mask layer 30 includes a first mask layer 32, a second mask layer 34, and a third mask layer 36. The first mask layer 32 is a pad oxide layer made of a silicon oxide, which can be formed by a thermal oxidation in certain embodiments. The second mask layer 34 is made of a silicon nitride (SiN) and the third mask layer 36 is made of a silicon oxide in certain embodiments, both of which may be formed by CVD, including LPCVD and PECVD, PVD, ALD, or other suitable processes. The mask layer 30 is subsequently patterned into a mask pattern 38 by using patterning operations including photolithography and etching, as shown in FIG. 4.

Figure 5:
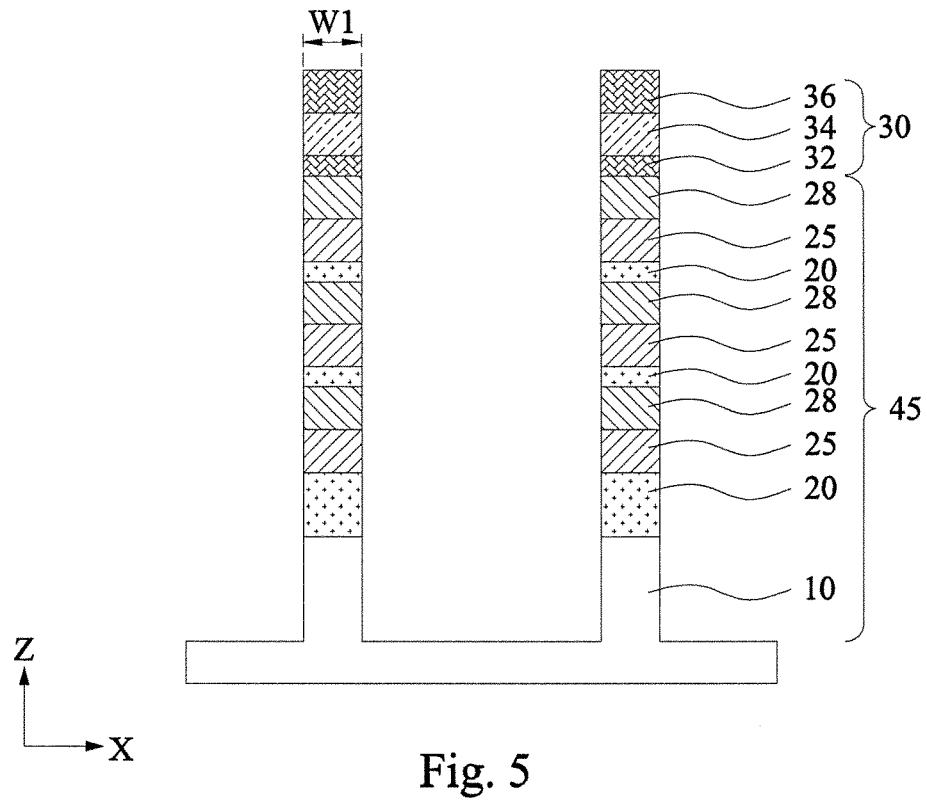
FIG. 5 shows a sequential process performed on the device of FIG. 4 for manufacturing a GAA FET device according to an embodiment of the present disclosure.

Next, as shown in FIG. 5, which is a cross-sectional view corresponding to line A-A of FIG. 1, the stacked layers of the first, second, and third semiconductor layers 20, 25, and 28, the optional strain-relaxed buffer layer 12, and the substrate 10 are patterned using semiconductor etching techniques, to form fins 45 having a width W1 ranging from about 4 nm to about 16 nm in some embodiments.

Figure 6:
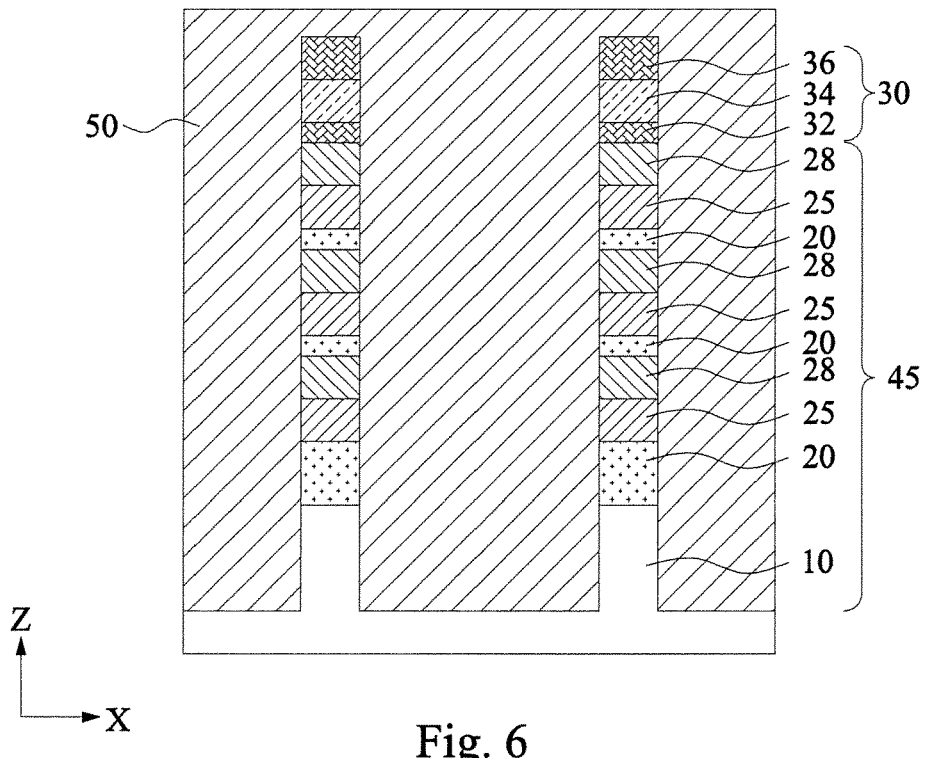
FIG. 6 shows a sequential process performed on the device of FIG. 5 for manufacturing a GAA FET device according to an embodiment of the present disclosure.

After the fins 45 are formed, an isolation insulating layer 50 including one or more layers of insulating material is formed over the substrate 10 in some embodiments so that the fins 45 are fully embedded in the insulating layer 50, as shown in FIG. 6. The insulating material for the insulating layer 50 may include silicon oxide, silicon nitride, silicon oxynitride (SiON), SiOCN, fluorine-doped silicate glass (FSG), a low-k dielectric material formed by LPCVD, PECVD or flowable CVD, or any combination thereof. An anneal operation may be performed after the formation of the isolation insulating layer 50.

Figure 7:
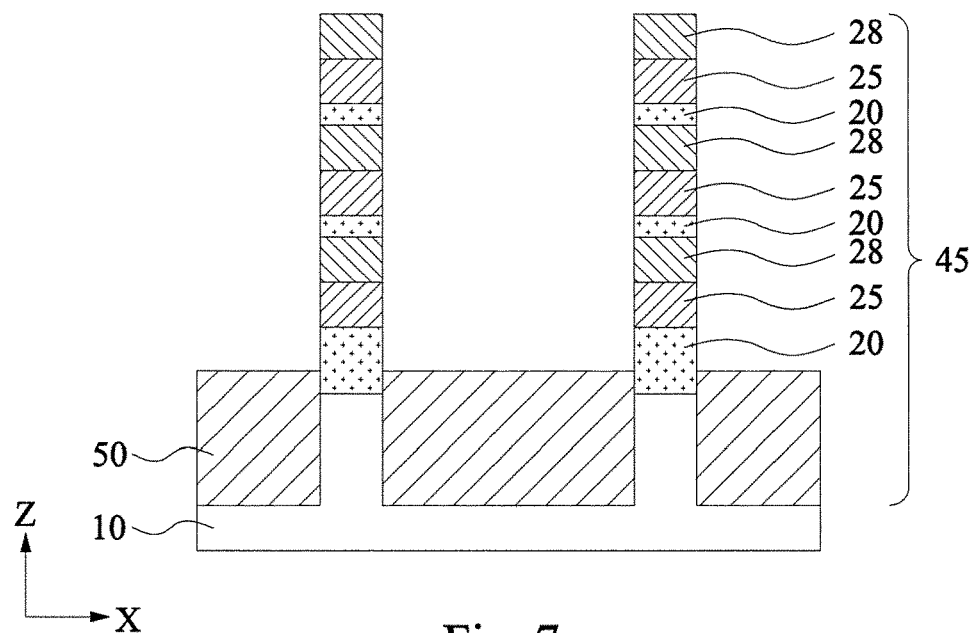
FIG. 7 shows a sequential process performed on the device of FIG. 6 for manufacturing a GAA FET device according to an embodiment of the present disclosure.

A planarization operation, such as a chemical mechanical polishing (CMP) method and/or an etch-back method, is subsequently performed to remove the upper portion of the isolation insulating layer 50 and the mask layer 30. The isolation insulating layer 50 is subsequently recess etched using suitable anisotropic etching techniques to expose the fins 45, as shown in FIG. 7. In some embodiments, the bottom first semiconductor layer 20 is partially exposed from the isolation insulating layer 50.

Figure 8:
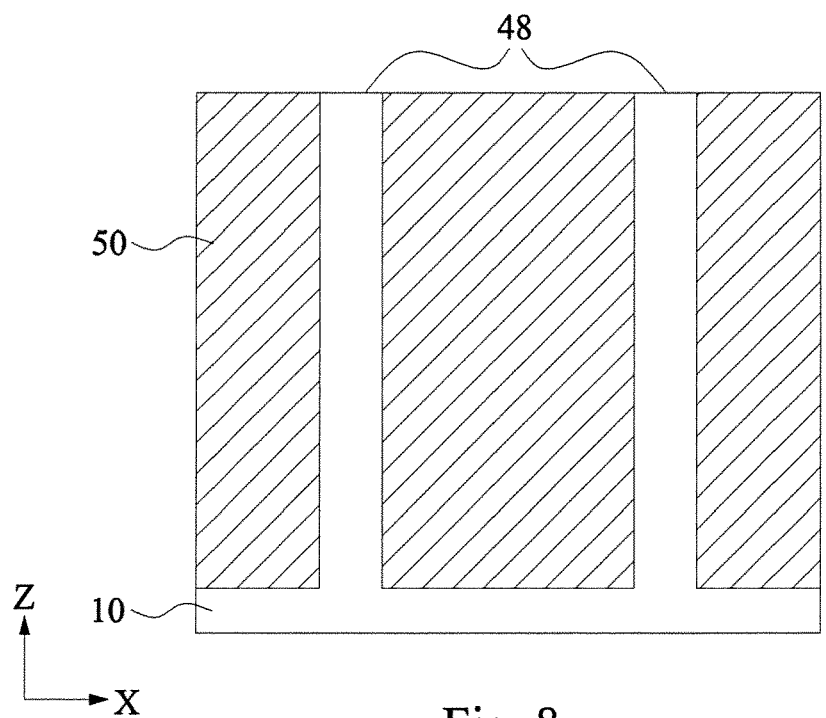
FIG. 8 shows a sequential process for manufacturing a GAA FET device according to another embodiment of the present disclosure.

FIGS. 8-11 show exemplary sequential processes for manufacturing a GAA FET device according to another embodiment of the disclosure. FIGS. 8-11 illustrate an alternative method for forming the fins 45. Dummy fins 48 are formed on a semiconductor substrate 10 by suitable photolithographic and etching techniques. An isolation insulating layer 50 including one or more layers of insulating material is formed over the substrate 10 so that the fins 48 are fully embedded in the insulating layer 50, as described with reference to FIG. 6. The isolation insulating layer 50 is subsequently planarized by a suitable planarization technique, such as a CMP method and/or an etch-back method, to expose upper surfaces of the dummy fins 48, as shown in FIG. 8.

Figure 9:
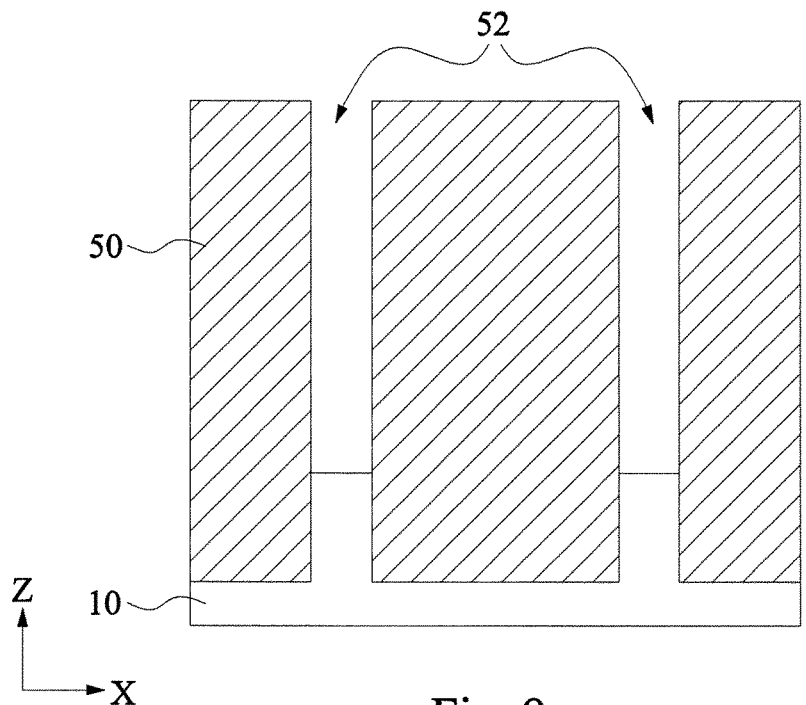
FIG. 9 shows a sequential process performed on the device of FIG. 8 for manufacturing a GAA FET device according to an embodiment of the present disclosure.
Figure 10:
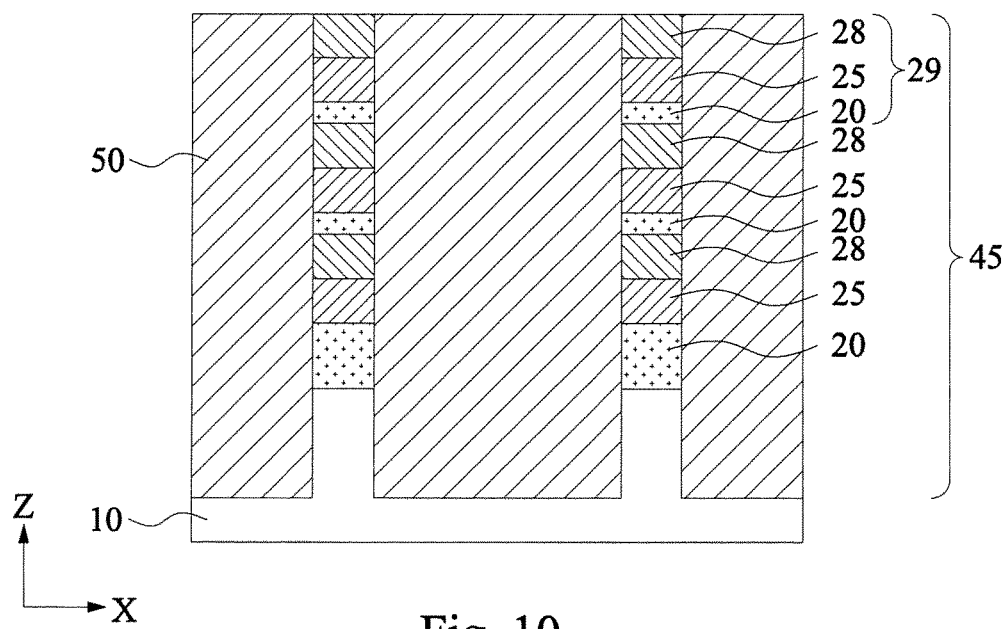
FIG. 10 shows a sequential process performed on the device of FIG. 9 for manufacturing a GAA FET device according to an embodiment of the present disclosure.

As shown in FIG. 9, the dummy fins 48 are selectively recess etched by using etching techniques, such as a wet etch selective to the dummy fin material, to form trenches 52 in some embodiments. A first semiconductor layer 20, which may also function as a strain-relaxed buffer layer is epitaxially formed in the trenches 52 on the recessed fin structures in some embodiments, as shown in FIG. 10. Repeating first semiconductor layers 20, second semiconductor layers 25, and third semiconductor layers 28 made of different materials are epitaxially deposited in the trenches to form fins 45. The first, second, and third semiconductor layers 20, 25, and 28 may be materials having different lattice constants, including one or more layers of such as, but not limited to, Si, Ge, SiGe, GaAs, InSb, GaP, GaSb, InAlAs, InGaAs, GaSbP, GaAsSb, and InP.

From the top of the substrate 10 of the structure illustrated in FIG. 10, the semiconductor layers are periodically stacked as first semiconductor layer 20, second semiconductor layer 25, and third semiconductor layer 28 in some embodiments. This period 29 is repeated twice to provide 3 periods, as shown in FIG. 10. The number of periods 29 in a stack can range from 2 to 10 periods, or more. In certain embodiments, the number of periods 29 ranges from 4 to 6 periods.

In some embodiments, the first semiconductor layers 20, the second semiconductor layers 25, and the third semiconductor layers 28 are made of Si, a Si compound, SiGe, Ge, or a Ge compound. In some embodiments, the first semiconductor layer 20 is SiGe, the second semiconductor layer 25 is Ge, and the third semiconductor layer 28 is Ge. The SiGe in the first semiconductor layer 20 may be $Si_{1-x}Ge_x$, where $0.4 \leq x \leq 0.6$. In other embodiments, the second semiconductor layer 25 is $Si_{1-y}Ge_y$, the third semiconductor layer 28 is $Si_{1-z}Ge_z$, and the first semiconductor layer 20 is $Si_{1-x}Ge_x$, where $0<z<x<y<1$, where $0.4 \leq x \leq 0.6$.

In certain embodiments, the first, second, and third semiconductor layers 20, 25, and 28 are doped with up to $2\times10^{20}$ dopants/cm$^3$. The dopants can be n-type or p-type semiconductor dopants, including As, Sb, P, B, Ga, and Al.

The first semiconductor layers 20, second semiconductor layers 25, and third semiconductor layers 28 are epitaxially formed over the substrate 10. The thickness of each of the second semiconductor layers 25 may be equal to each other, and are in a range from about 3 nm to about 15 nm in some embodiments. In certain embodiments, the thickness of each of the second semiconductor layers 25 is in a range from about 5 nm to about 7 nm.

The thicknesses of the third semiconductor layers 28 are in a range from about 3 nm to about 15 nm in some embodiments. In certain embodiments, the thickness of the third semiconductor layers 28 ranges from about 5 nm to about 7 nm.

In some embodiments, the first first semiconductor layer 20 on the substrate 10 has a thickness ranging from about 50 nm to about 150 nm, and the thicknesses of the upper first semiconductor layers 20 above the first first semiconductor layer are in a range from about 2 nm to about 10 nm. In certain embodiments, the thickness of the first first semiconductor layer 20 ranges from about 100 nm to about 120 nm and the thickness of the upper first semiconductor layers 28 ranges from about 3 nm to about 5 nm. In certain embodiments, the thickness of the second and third semiconductor layers 25 and 28 are about the same and the thickness of the first semiconductor layer 20 is less than the thickness of the second and third semiconductor layers 25 and 28.

The first, second, and third semiconductor layers 20, 25, and 28 may be formed by CVD, including MOCVD, LPCVD and PECVD, PVD, MBE, ALD, or other suitable processes.

Figure 11:
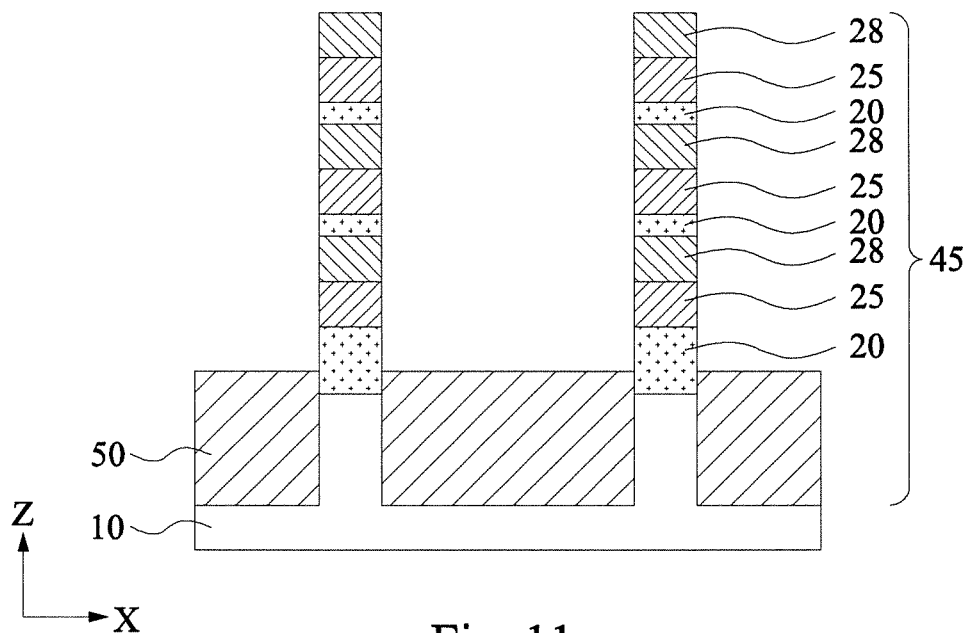
FIG. 11 shows a sequential process performed on the device of FIG. 10 for manufacturing a GAA FET device according to an embodiment of the present disclosure.
Figure 12:
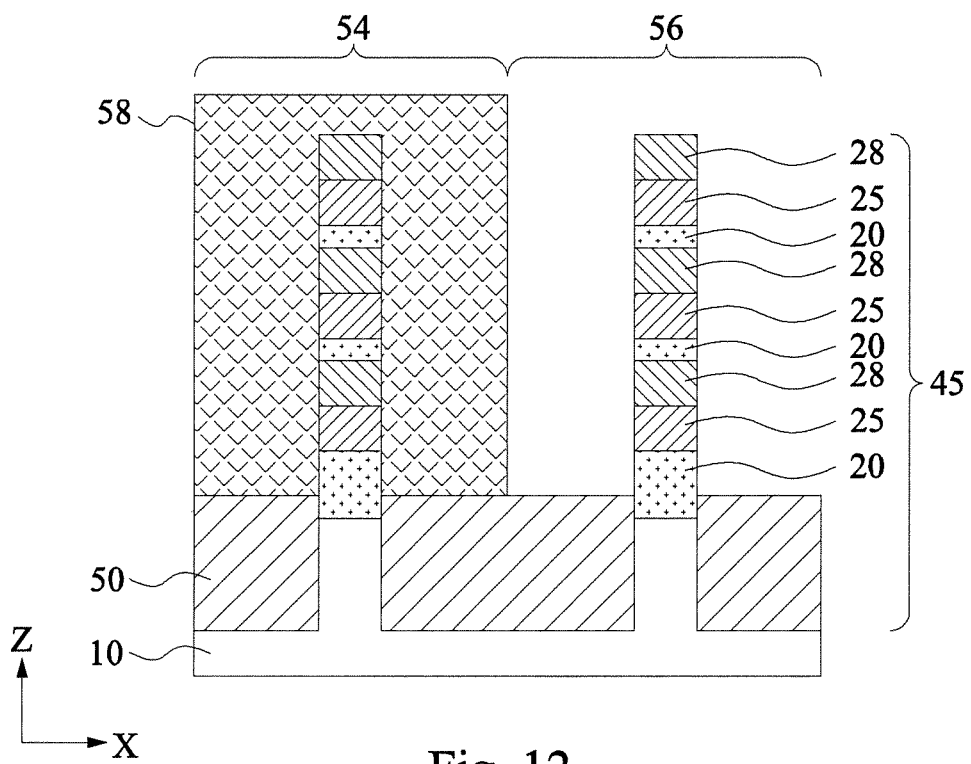
FIG. 12 shows a sequential process performed on the devices of FIG. 7 and FIG. 11 for manufacturing a GAA FET device according to an embodiment of the present disclosure.

The isolation insulating layer 50 is subsequently recess etched using suitable anisotropic etching techniques to expose the fins 45, as shown in FIG. 11, resulting in a similar structure to FIG. 7. In some embodiments, the bottom first semiconductor layer 20 is partially exposed from the isolation insulating layer 50.

FIGS. 12-19 show exemplary sequential processes for manufacturing a GAA FET device after the structures of FIGS. 7 and 11 are formed. The GAA FET device is a complementary metal oxide (CMOS) device in some embodiments. Embodiments of the CMOS device include a p-type and n-type field effect transistors (pFET and nFET). Adverting to FIG. 12, a first fin mask 58, is formed overlying a first FET region 54 of the semiconductor device, leaving a second FET region 56 exposed. In certain embodiments, the first FET region 54 is a pFET region and the second FET region 56 is an nFET region. The first fin mask 58 can be formed by suitable photolithographic techniques. The first fin mask 58 covers the fin 45 in the first FET region 54. In some embodiments, the first fin mask 58 is formed of a photoresist, in other embodiments, the first fin mask 58 is formed of a nitride, such as $Si_3N_4$.

Figure 13:
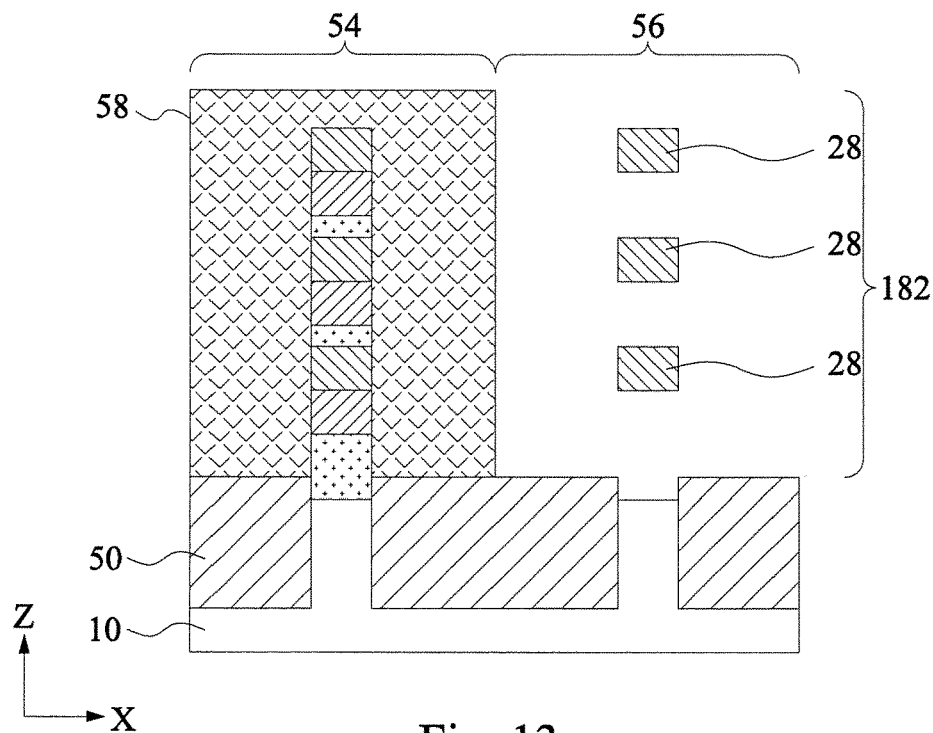
FIG. 13 shows a sequential process performed on the device of FIG. 12 for manufacturing a GAA FET device according to an embodiment of the present disclosure.

While the first FET region 54 is masked, the second FET region 56 is selectively etched to remove the first semiconductor layers 20 and the second semiconductor layers 25 leaving the remaining third semiconductor layers 28 as the second nanowire structure 182 including a plurality of stacked nanowires arranged in the Z direction formed from the third semiconductor layers 28, as shown in FIG. 13.

The first semiconductor layers 20 and second semiconductor layers 25 can be removed or etched using an etchant that selectively etches the first semiconductor layers 20 and second semiconductor layers 25 against the third semiconductor layers 28.

For example, when the second semiconductor layers 25 are formed of Ge, the third semiconductor layers 28 are formed of Si, and the first semiconductor layers 20 are formed of SiGe, the second semiconductor layers 25 and first semiconductor layers 20 can be selectively removed using a thermal etch technique using a gaseous mixture of HCl and $H_2$, or a dry etch technique using a plasma, such as $CF_4$, or a wet etch technique such as using, but not limited to, a mixture of hydrofluoric acid (HF), nitric acid ($HNO_3$), and acetic acid ($CH_3COOH$).

Figure 14:
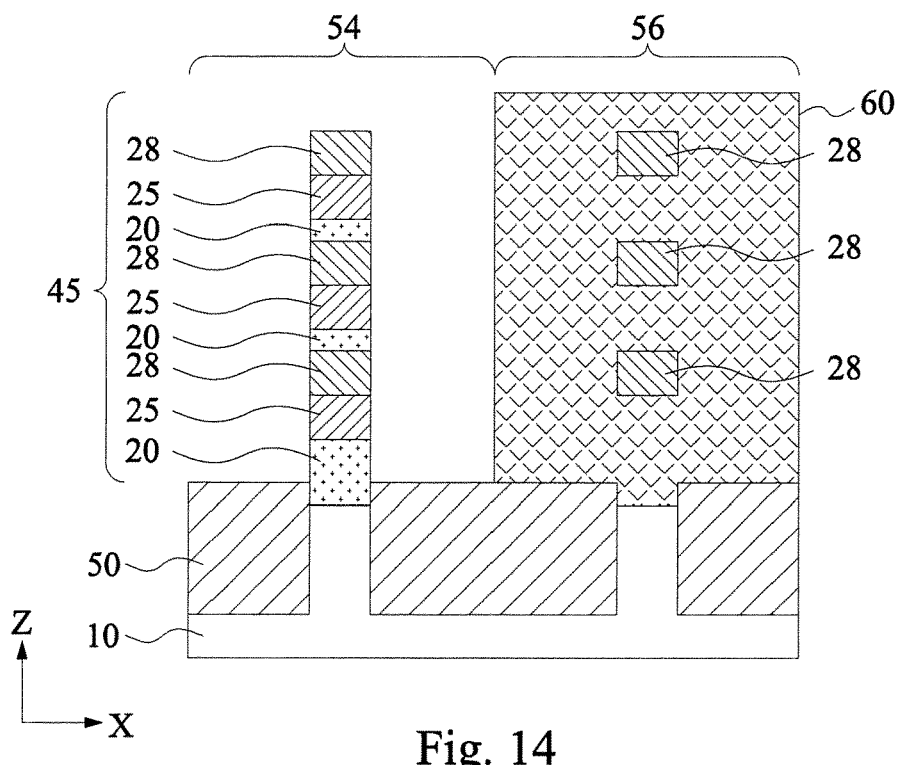
FIG. 14 shows a sequential process performed on the device of FIG. 13 for manufacturing a GAA FET device according to an embodiment of the present disclosure.

Adverting to FIG. 14, the first fin mask 58 is subsequently removed, such as by using a suitable stripping or ashing operation, and a second fin mask 60, is formed overlying the second FET region 56 of the semiconductor device, leaving the first FET region 54 exposed. The second fin mask 60 can be formed by suitable photolithographic techniques. The second fin mask 60 covers the fin 45 in the second FET region 56.

Figure 15:
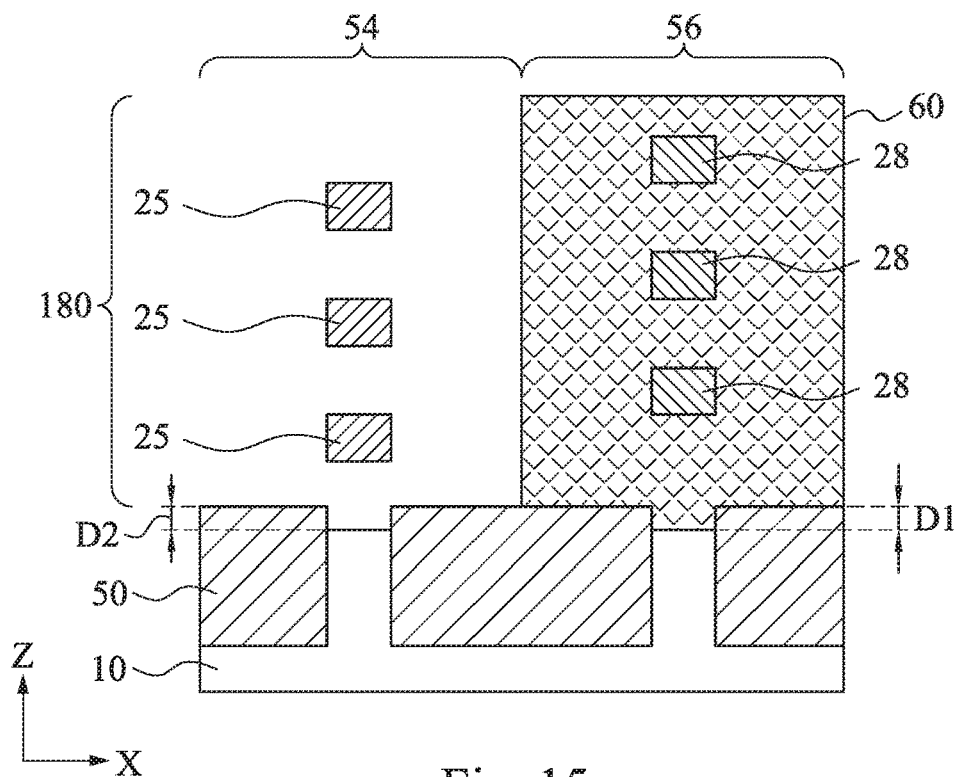
FIG. 15 shows a sequential process performed on the device of FIG. 14 for manufacturing a GAA FET device according to an embodiment of the present disclosure.

While the second FET region 56 is masked, the first FET region 54 is selectively etched to remove the third semiconductor layers 28 and the first semiconductor layers 20 leaving the remaining second semiconductor layers 25 as the first nanowire structure 180 including a plurality of stacked nanowires arranged in the Z direction formed from the second semiconductor layers 25, as shown in FIG. 15. The nanowires 25 extend in the Y direction (into the page as shown in FIG. 15).

The third semiconductor layers 28 and first semiconductor layers 20 can be removed by etching using etchants that selectively etch the third semiconductor layers 28 and first semiconductor layers 20 against the second semiconductor layers 25.

For example, when the first semiconductor layers 20 are formed of SiGe, the second semiconductor layers 25 are formed of Ge, and the third semiconductor layers 28 are formed of Si, the third semiconductor layers 28 and first semiconductor layers 20 can be selectively removed using a two-operation process including a first operation of either dry etching or wet etching the third semiconductor layers 28 in some embodiments. The dry etching operation may be performed using a plasma mixture of $CF_4$, $O_2$, and $N_2$. The wet operation may include a first sub-operation of oxidizing the silicon third semiconductor layer 28 by exposure to $HNO_3$ or hydrogen peroxide ($H_2O_2$) followed by a second sub-operation of removal of the oxidized silicon (e.g. $-SiO_2$) by exposure to an HF solution. The second operation selectively etches the SiGe first semiconductor layer 20 relative to the Ge second semiconductor layer 25. The first semiconductor layer 20 can be removed by etching with a wet etchant, such as tetramethyl ammonium hydroxide (TMAH). In some embodiments, the etching of the first FET region 54 also etches a portion of the substrate 10. Thus, the depth D2 of the recess in the isolation insulation layer 50 in the first FET region 54 is greater than the depth D1 of the recess in the isolation insulation layer 50 in the second FET region.

Figure 16:
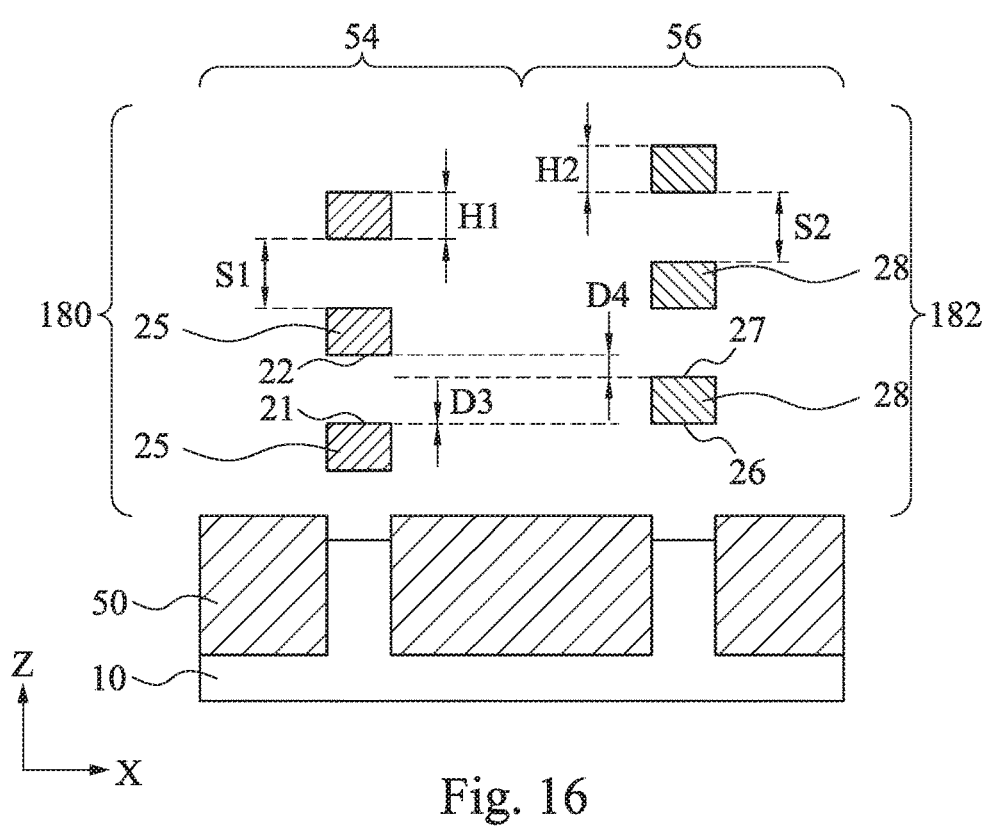
FIG. 16 shows a sequential process performed on the device of FIG. 15 for manufacturing a GAA FET device according to an embodiment of the present disclosure.

Adverting to FIG. 16, the second fin mask 60 is subsequently removed, such as by using a suitable stripping or ashing operation.

The first FET nanowires 25 have a height H1 and the second FET nanowires 28 have a height H2. In certain embodiments, the height H1 is about the same as the height H2. Immediately adjacent first FET nanowires 25 are spaced-apart from each other by a distance S1, and immediately adjacent second FET nanowires 28 are spaced-apart from each other by a distance S2.

In some embodiments, the height H1 of the first FET nanowires 25 is not equal to the distance S2 of the spacing between immediately adjacent second FET nanowires 28. In some embodiments, the height H1 of the first FET nanowires 25 is less than the distance S2 of the spacing between immediately adjacent second FET nanowires 28. Likewise, in some embodiments, the height H2 of the second FET nanowires 28 is not equal to distance S1 of the spacing between immediately adjacent first FET nanowires 25. In some embodiments, the height H2 of the second FET nanowires 28 is less than the distance S1 of the spacing between immediately adjacent first FET nanowires 25.

In some embodiments, the distance S1 of the spacing between immediately adjacent first FET nanowires 25 is greater than the height H1 of the first FET nanowires 25. Likewise, in some embodiments, the distance S2 of the spacing between immediately adjacent second FET nanowires 28 is greater than the height H2 of the second FET nanowires 28.

In some embodiments, immediately adjacent nanowires in the nanowire structures are spaced-apart by a substantially equal distance. As shown in FIG. 16, the arrangement of the first FET nanowires 25 and the second FET nanowires 28 are staggered along the X-direction, in some embodiments.

In some embodiments, a distance D3 between a top surface 21 in the Z-direction of a first nanowire 25 and a bottom surface 26 in the Z-direction of the closest second nanowire 28 is less than a distance D4 between the top surface 27 in the Z-direction of a second nanowire 28 and a bottom surface 22 in the Z-direction of the closest first nanowire 25. In certain embodiments, top surface 21 of the first nanowire 25 and bottom surface 26 of the second nanowire 28 are substantially at the same height, as shown in FIG. 16. Therefore, the distance D3 between the top surface 21 of the first nanowire 25 and the bottom surface 26 of the second nanowire 28 is substantially zero in certain embodiments.

Figure 17A:
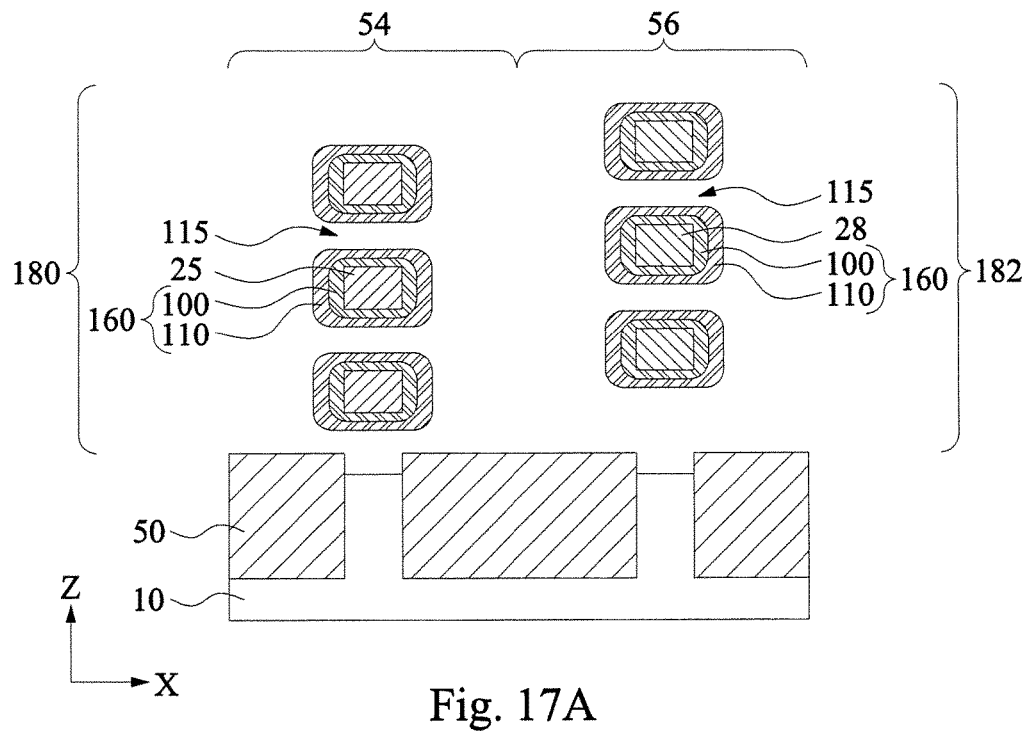
FIG. 17A shows a sequential process performed on the device of FIG. 16 for manufacturing a GAA FET device according to an embodiment of the present disclosure.

A gate electrode structure 160 is subsequently formed around each of the plurality of nanowires 25 and 28. The gate electrode structure is formed around a first portion of the nanowires that is the channel region of the nanowires. The gate electrode structures 160 include a gate dielectric layer 100 formed around each of the nanowires 25 and 28 and gate electrode layers 110 formed on the gate dielectric layers 100, as shown in FIGS. 17A-19, in some embodiments. As shown in FIG. 17A, the gate electrode structures 160 wraps around each nanowire 25 and 28, and the gate electrode structures are spaced-apart from each other by a gap 115 between immediately adjacent nanowires 25 and 28 in each nanowire structure 180 and 182, in some embodiments. Thus, the individual gate electrode structures 160 do not merge in some embodiments.

In certain embodiments, the gate dielectric layer 100 includes one or more layers of a dielectric material, such as silicon oxide, silicon nitride, high-k dielectric material, other suitable dielectric material, and any combination thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, or any combination thereof. In some embodiments, the gate dielectric layer 100 includes an interfacial layer (not shown) formed between the nanowires and the dielectric material.

The gate dielectric layer 100 may be formed by CVD, ALD, or any suitable method. In one embodiment, the gate dielectric layer 100 is formed using a highly conformal deposition process such as ALD in order to ensure the formation of a gate dielectric layer having a uniform thickness around each channel layer. The thickness of the gate dielectric layer 100 is in a range from about 1 nm to about 6 nm in some embodiments.

The gate electrode layer 110 is formed on the gate dielectric layer 100 to wrap around each nanowire. The gate electrode layer 110 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, or any combination thereof.

The gate electrode layer 110 may be formed by CVD, ALD, electroplating, or other suitable method.

In certain embodiments of the present disclosure, one or more work function adjustment layers (not shown) are interposed between the gate dielectric layer 100 and the gate electrode 110. The work function adjustment layers are made of a conductive material such as a single layer of TiN, TaN, TaAlC, TiC, TaC, Co, Al, TiAl, HfTi, TiSi, TaSi, TiAlC, a multilayer of two or more of these materials, or any combination thereof. For the nFET, one or more of TaN, TaAlC, TiN, TiC, Co, TiAl, HfTi, TiSi and TaSi is used as the work function adjustment layer, and for the pFET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the nFET and the pFET, which may use different metal layers.

Figure 17B:
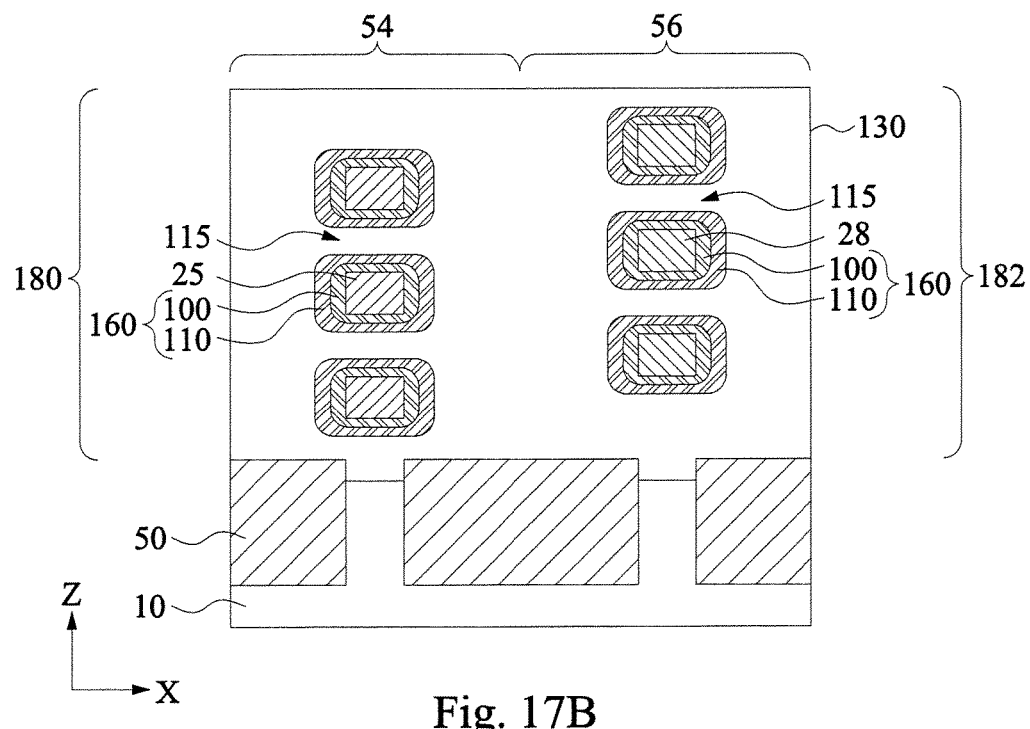
FIG. 17B is a cross section corresponding to line E-E of FIG. 17D and shows a sequential process performed on the device of FIG. 17A for manufacturing a GAA FET device according to an embodiment of the present disclosure.

A conductive layer 130 is formed in some embodiments to surround the nanowire structures and to fill the gaps 115 between the nanowires, as shown in FIG. 17B. The conductive layer may be formed by any suitable conductive material, such as a metal, including tungsten (W). The conductive material may be deposited by any suitable deposition technique, including CVD, ALD, electroplating, or other suitable method.

Figure 17D:
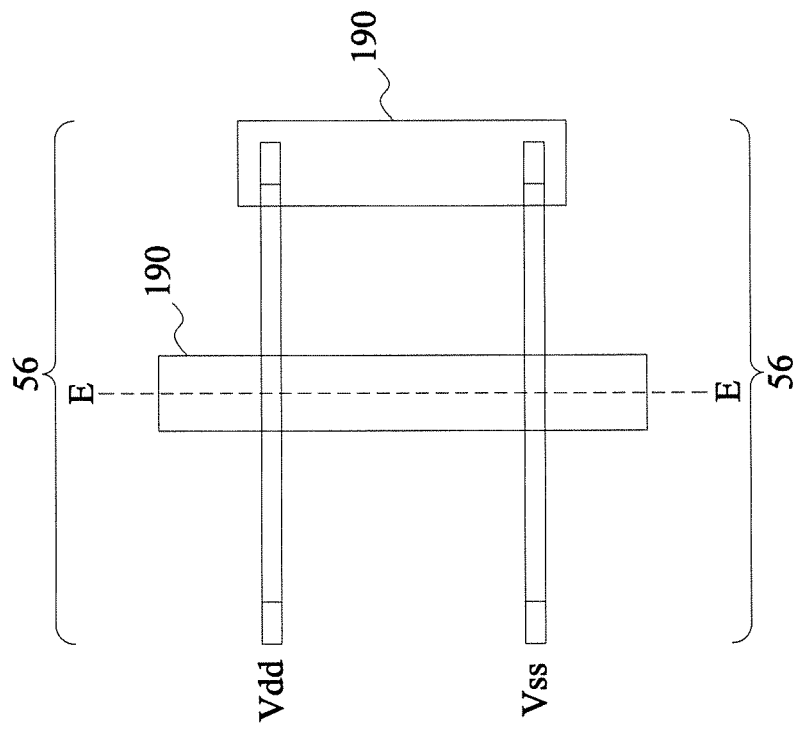
FIG. 17D is a plan view of the device shown in FIG. 17B.
Figure 17C:
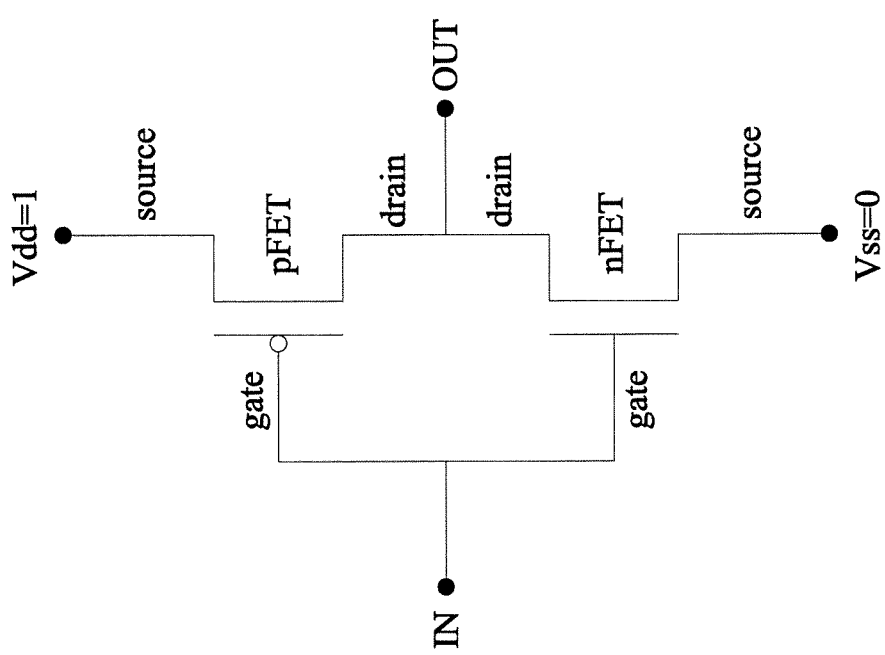
FIG. 17C shows a circuit formed according to an embodiment of the present disclosure.

An example of a CMOS circuit with an n-channel FET (nFET) combined with a p-channel FET (pFET) according to an embodiment of the disclosure is shown in FIG. 17C. The circuit is an inverter including an nFET and a pFET in series. The connected gates are the input and the connected drains are the output. If the input is high (Vdd=1), the nFET is in on-state, i.e., it conducts and pulls the output to low (Vss=0). At the same time, the pFET is in off-state, and hence does not conduct and there is very little standby leakage current. If the input is low the situation is inverted (nFET off, pFET on, output high). FIG. 17D is a plan view of the circuit of FIG. 17C. The conductive layer 130 connects the gates of the nFET 56 and pFET 54. The drains of the nFET 56 and the pFET 54 are connected by an interconnect 190. A cross section along line E-E corresponds to FIG. 17B.

Figure 19:
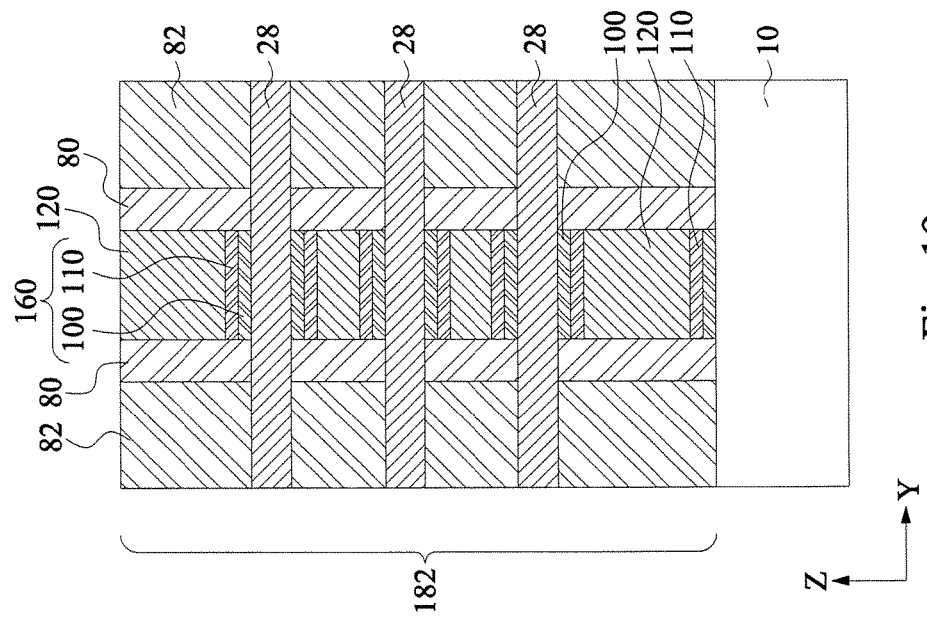
FIG. 19 is a cross section corresponding to line C-C of FIG. 1 and shows a sequential process for manufacturing a GAA FET device according to embodiments of the present disclosure.
Figure 18:
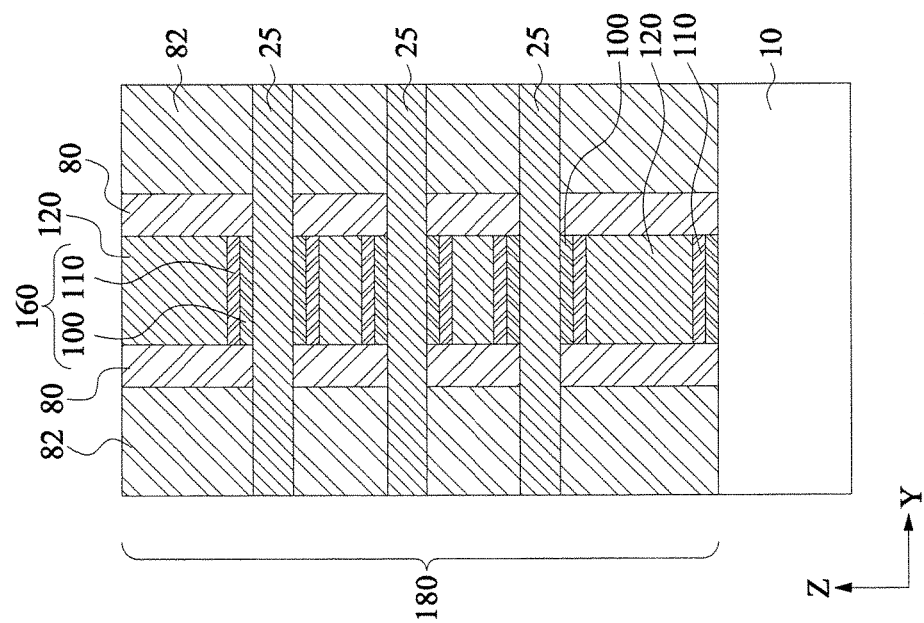
FIG. 18 is a cross section corresponding to line B-B of FIG. 1 and shows a sequential process for manufacturing a GAA FET device according to an embodiment of the present disclosure.

In some embodiments, insulating sidewalls 80 are formed on opposing sides of the gate electrode structure 160 and source/drain regions 82 are formed on second portions of the nanowires on opposing sides of the gate electrode structures 160. The insulating sidewalls 80 are between the gate electrode structures 160 and the source/drain regions 82, as shown in FIGS. 18 and 19. FIG. 18 corresponds to a cross section according to line B-B of FIG. 1 of the first nanowire structure 180 and FIG. 19 corresponds to a cross section according to line C-C of FIG. 1 of the second nanowire structure 182.

The material for the source/drain layers 82 include one or more layers of Ge or SiGe, for pFETs, and one or more layers of Si, SiP, or SiC for nFETs. The source/drain layers 82 are formed by an epitaxial growth method using CVD, ALD, or molecular beam epitaxy (MBE). When the source/drain layer 82 for a pFET is formed, the nanowire structure 182 of the nFETs is covered by a protective layer, such as $SiO_2$, and when the source/drain layer 82 for an N-type FET is formed, the nanowire structure 180 of pFETs are covered by a protective layer.

In order to support the nanowires during processing, the portions of the nanowire structures 180 and 182 where the source/drain regions 82 are formed may be masked during the removal of either the first and third semiconductor layers 20 and 28 or the first and second semiconductor layers 20 and 25 from the portions of the nanowires where the gate electrode structures 160 are to be formed. After formation of the gate electrode structures 160 and the formation of an insulating layer 115 between the gate electrode structures 160, the portion of the nanowires where the gate electrode structures 160 are formed may be masked, and the respective first and second semiconductor layers 20 and 25 or first and third semiconductor layers 20 and 28 are removed from the portions of the nanowire structures 182 and 180 where the source/drain regions 82 are formed.

Alternatively, in some embodiments dummy gate structures are initially formed on the fin structures 45 (see FIGS. 12 and 14), and the respective first and second semiconductor layers 20 and 25 or first and third semiconductor layers 20 and 28 are removed from the portions of the nanowire structures 182 and 180 where the source/drain regions 82 are formed. After forming the source and drain regions 82, the source/drain regions are masked, and the dummy gate electrode structures are removed, followed by formation of gate electrode structures 160 according to the present disclosure.

In other embodiments, end regions of the fin structures 45 (see FIGS. 12 and 14), are masked during the removal of the respective first and second semiconductor layers 20 and 25 or first and third semiconductor layers 20 and 28 so that end portions of the fins anchor the nanowires during subsequent processing. After removal of the respective first and second semiconductor layers 20 and 25 or first and third semiconductor layers 20 and 28, the gate electrode structures 160 and source/drain regions 82 are formed. The respective first and second semiconductor layers 20 and 25 or first and third semiconductor layers 20 and 28 in the end portions of the fins 45 can be removed after formation of the gate electrode structures 160 and source/drain regions 82.

The present disclosure is not limited to fin structures comprising three stacked nanowires. In certain embodiments, additional nanowires may be included in each nanowire structure 180, 182.

It is understood that the GAA FETs undergo further CMOS processes to form various features such as contacts/vias, interconnect metal layers, dielectric layers, passivation layers, etc.

FIGS. 20-31 show exemplary sequential processes for manufacturing GAA FET devices according to other embodiments of the present disclosure. It is understood that additional operations can be provided before, during, and after processes shown by FIGS. 20-31, and some of the operations described below can be replaced or eliminated, for certain embodiments of the method. The order of the operations/processes may be interchangeable.

Figure 20:
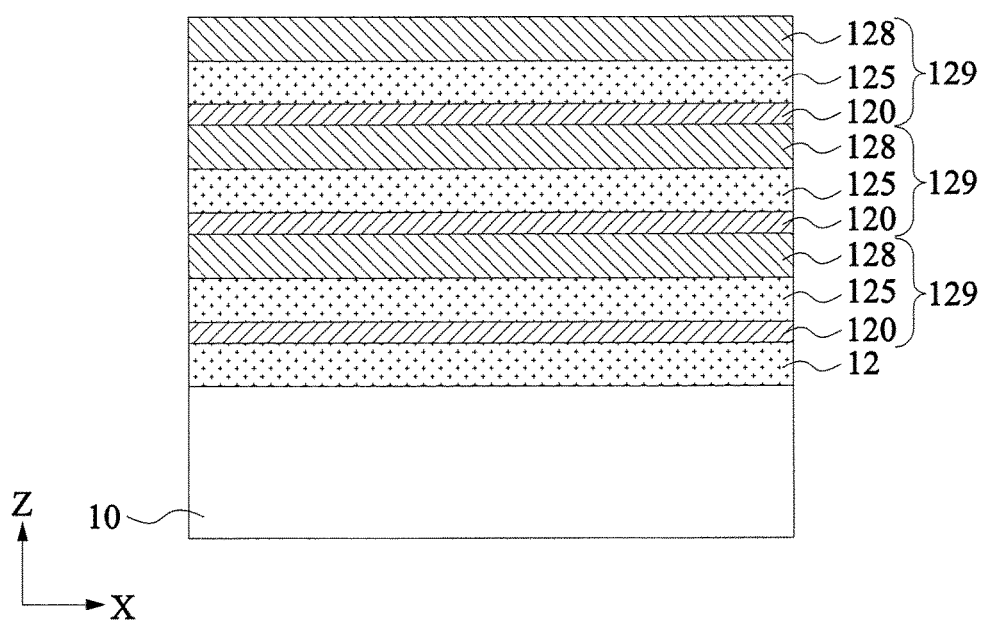
FIG. 20 shows a sequential process for manufacturing a GAA FET device according to another embodiment of the present disclosure.

As shown in FIG. 20, stacked semiconductor layers are formed over a substrate 10. The stacked semiconductor layers include first semiconductor layers 120, second semiconductor layers 125, and third semiconductor layers 128. FIG. 20 corresponds to a cross-section view taken along line A-A of FIG. 1.

In one embodiment, substrate 10 includes a single crystalline semiconductor layer on at least its surface portion. In a certain embodiment, the substrate 10 is made of Si. The substrate 10 may include in its surface region, one or more strain-relaxed buffer layers 12. The strain-relaxed buffer layers 12 can serve to gradually change the lattice constant from that of the substrate to that of the source/drain regions to prevent defects from forming in the overlying semiconductor layers. The strain-relaxed buffer layers may be formed from an epitaxially grown single crystalline semiconductor material. In a particular embodiment, a silicon germanium (SiGe) strain-relaxed buffer layer 12 is epitaxially grown to a thickness ranging from about 50 nm to about 150 nm on the silicon substrate 10. In other embodiments, the thickness of the strain-relaxed buffer layer 12 ranges from about 80 to about 120 nm. The germanium concentration of the SiGe buffer layers may increase from 20 atomic % for the bottom-most buffer layer to 80 atomic % for the top-most buffer layer.

In certain embodiments, a first semiconductor layer 120 is formed on the optional strain-relaxed buffer layer 12. In certain embodiments, the strain-relaxed buffer layer is $Si_{0.5}Ge_{0.5}$.

The first semiconductor layers 120, second semiconductor layers 125, and third semiconductor layers 128 are made of different materials, including materials having different lattice constants, and may include one or more layers of such as, but not limited to, Si, Ge, SiGe, GaAs, InSb, GaP, GaSb, InAlAs, InGaAs, GaSbP, GaAsSb, and InP.

In some embodiments, the first semiconductor layers 120, the second semiconductor layers 125, and the third semiconductor layers 128 are made of Si, a Si compound, SiGe, Ge, or a Ge compound. In some embodiments, the first semiconductor layer 120 is Ge, the second semiconductor layer 125 is SiGe, and the third semiconductor layer 128 is Si. The SiGe in the second semiconductor layer 125 may be $Si_{1-x}Ge_x$, where $0.2 \leq x \leq 0.8$. In other embodiments, the first semiconductor layer 120 is $Si_{1-y}Ge_y$, the third semiconductor layer 128 is $Si_{1-z}Ge_z$, and the second semiconductor layer 125 is $Si_{1-x}Ge_x$, where $0<z<x<y<1$, where $0.2 \leq x \leq 0.8$.

In certain embodiments, the first, second, and third semiconductor layers 120, 125, and 128 are doped with up to $2 \times 10^{20}$ dopants/$cm^3$. The dopants can be n-type or p-type semiconductor dopants, including As, Sb, P, B, Ga, and Al.

From the top of the substrate 10 or the optional strain-relaxed buffer layer 12, the semiconductor layers are periodically stacked as a first semiconductor layer 120, second semiconductor layer 125, and third semiconductor layer 128 in some embodiments. This period is 129 repeated twice to provide 3 periods, as shown in FIG. 20. The number of periods 129 in a stack can range from 2 to 10 periods, or more. In certain embodiments, the number of periods 129 ranges from 4 to 6 periods. By adjusting the numbers of the stacked layers, a driving current of the GAA FET device can be adjusted.

The first semiconductor layers 120, second semiconductor layers 125, and third semiconductor layers 128 are epitaxially formed over the substrate 10. The thickness of each of the first semiconductor layers 120 may be equal to each other, and are in a range from about 2 nm to about 10 nm in some embodiments. In certain embodiments, the thickness of each of the first semiconductor layers 120 is in a range from about 3 nm to about 5 nm.

The thicknesses of the third semiconductor layers 128 are in a range from about 3 nm to about 15 nm in some embodiments. In certain embodiments, the thickness of the third semiconductor layers 128 ranges from about 5 nm to about 7 nm.

The thicknesses of the second semiconductor layers 125 are in a range from about 3 nm to about 15 nm in some embodiments. In certain embodiments, the thickness of the second semiconductor layers 125 ranges from about 5 nm to about 7 nm.

In certain embodiments, the thickness of the second and third semiconductor layers 125 and 128 are about the same and the thickness of the first semiconductor layer 120 is less than the thickness of the second and third semiconductor layers 125 and 128.

The first, second, and third semiconductor layers 120, 125, and 128 may be formed by CVD, including MOCVD, LPCVD, and PECVD, PVD, MBE, ALD, or other suitable processes.

Figure 21:
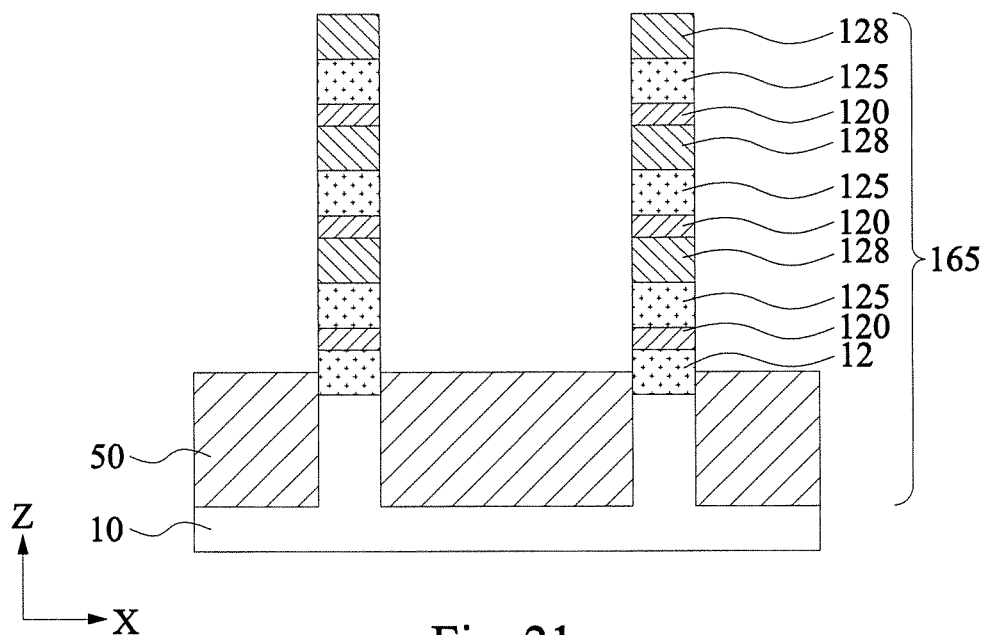
FIG. 21 shows a sequential process performed on the device of FIG. 20 for manufacturing a GAA FET device according to an embodiment of the present disclosure.

Next, as shown in FIG. 21 a plurality of fins 65 projecting from an isolation insulation layer 50 are formed by patterning the stacked semiconductor layers as described herein in reference to FIGS. 3-7. A mask layer is formed over the stacked layers, the mask layer is patterned into a mask pattern by using patterning operations including photolithography and etching, the stacked layers of the first, second, and third semiconductor layers 120, 125, and 128 and the substrate 10 are patterned by etching using the mask pattern to form fins 65. After the fins 65 are formed, an isolation insulating layer 50 including one or more layers of insulating material is formed over the substrate 10, and a planarization operation, such as a chemical mechanical polishing (CMP) method and/or an etch-back method, is subsequently performed to remove the upper portion of the isolation insulating layer and the mask layer. The isolation insulating layer 50 is subsequently recess etched using suitable anisotropic etching techniques to expose the fins 65, as shown in FIG. 21. In some embodiments, the optional strain-relaxed buffer layer 12 is partially exposed from the isolation insulating layer 50.

Figure 22:
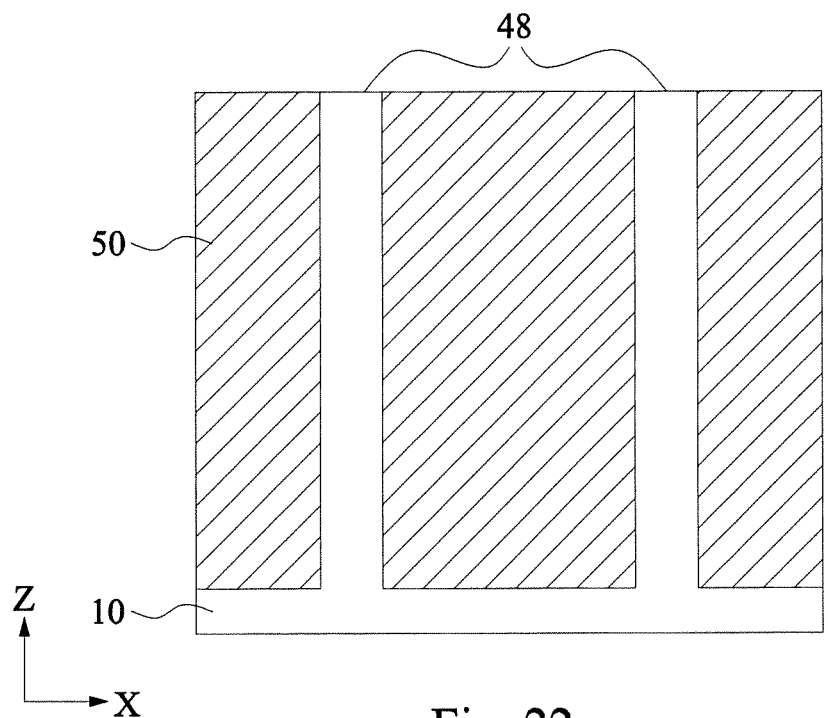
FIG. 22 shows a sequential process for manufacturing a GAA FET device according to another embodiment of the present disclosure.

FIGS. 22-25 show an exemplary sequential processes for manufacturing a GAA FET device according to another embodiment of the disclosure. FIGS. 22-25 illustrate an alternative method for forming the fins 65, similar to the method described in FIGS. 8-11. Dummy fins 48 are formed on a semiconductor substrate 10 by suitable photolithographic and etching techniques. An isolation insulating layer 50 including one or more layers of insulating material is formed over the substrate 10 so that the fins 48 are fully embedded in the insulating layer 50. The isolation insulating layer 50 is subsequently planarized by a suitable planarization technique, such as a chemical mechanical polishing (CMP) method and/or an etch-back method, to expose upper surfaces of the dummy fins 48, as shown in FIG. 22.

Figure 23:
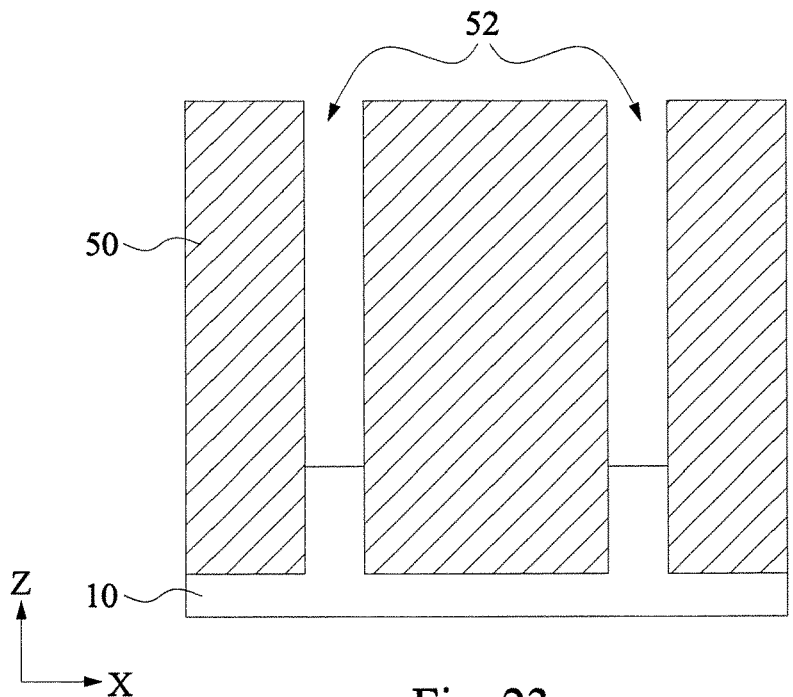
FIG. 23 shows a sequential process performed on the device of FIG. 22 for manufacturing a GAA FET device according to an embodiment of the present disclosure.
Figure 24:
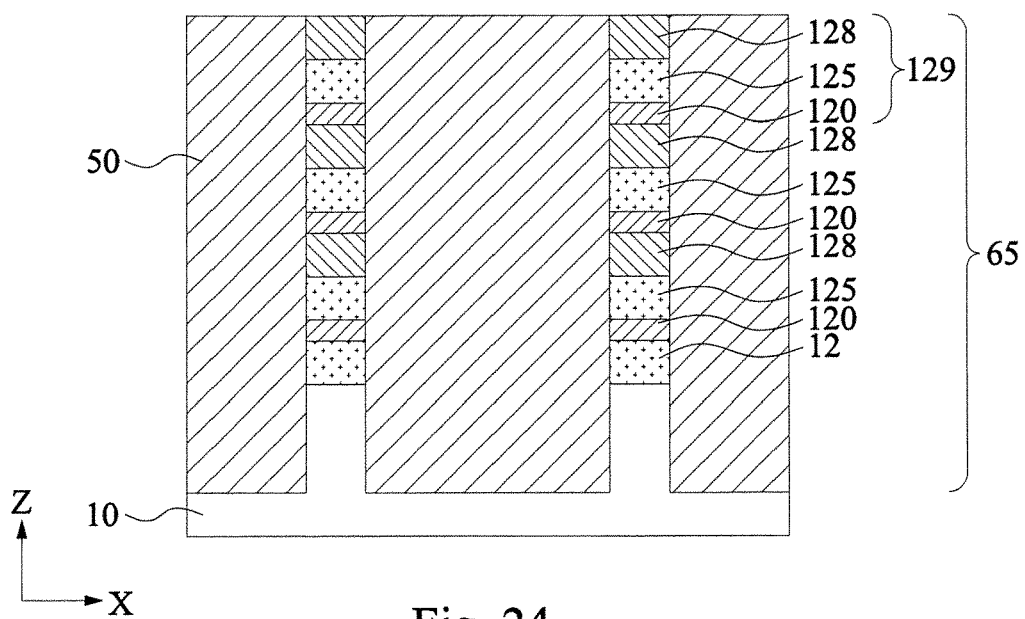
FIG. 24 shows a sequential processes performed on the device of FIG. 23 for manufacturing a GAA FET device according to an embodiment of the present disclosure.

As shown in FIG. 23, the dummy fins 48 are selectively recessed etched by using etching techniques, such as a wet etch selective to the dummy fin material, to form trenches 52 in some embodiments. An optional strain-relaxed buffer layer 12 is epitaxially formed in the trenches 52 on the recessed fin structures in some embodiments, as shown in FIG. 24. Repeating first semiconductor layers 120, second semiconductor layers 125, and third semiconductor layers 128 made of different materials, including materials having different lattice constants, including one or more layers of such as, but not limited to, Si, Ge, SiGe, GaAs, InSb, GaP, GaSb, InAlAs, InGaAs, GaSbP, GaAsSb, and InP are epitaxially deposited in the trenches to form fins 65. In certain embodiments, the strain-relaxed buffer layer 12 is formed of the same material as the second semiconductor layer 125.

From the top of the substrate 10 or the optional strain-relaxed buffer layer 12, the semiconductor layers are periodically stacked as first semiconductor layer 120, second semiconductor layer 125, and third semiconductor layer 128 in some embodiments. This period 129 is repeated twice to provide 3 periods, as shown in FIG. 24. The number of periods 129 in a stack can range from 2 to 10 periods. In certain embodiments, the number of periods 129 ranges from 4 to 6 periods. In some embodiments, the first semiconductor layers 120, the second semiconductor layers 128, and the third semiconductor layers 125 are made of Si, a Si compound, SiGe, Ge, or a Ge compound. In some embodiments, the first semiconductor layer 120 is Ge, the second semiconductor layer 125 is SiGe, and the third semiconductor layer 125 is Si. The SiGe in the second semiconductor layer 125 may be $Si_{1-x}Ge_x$, where $0.2 \leq x \leq 0.8$. In other embodiments, the first semiconductor layer 120 is $Si_{1-y}Ge_y$, the third semiconductor layer 128 is $Si_{1-z}Ge_z$, and the second semiconductor layer 125 is $Si_{1-x}Ge_x$, where $0<z<x<y<1$, where $0.2 \leq x \leq 0.8$.

In certain embodiments, the first, second, and third semiconductor layers 120, 125, and 128 are doped with up to $2 \times 10^{20}$ dopants/cm$^3$. The dopants can be n-type or p-type semiconductor dopants, including As, Sb, P, B, Ga, and Al.

The first semiconductor layers 120, second semiconductor layers 125, and third semiconductor layers 128 are epitaxially formed over the substrate 10. The thickness of each of the first semiconductor layers 120 may be equal to each other, and are in a range from about 2 nm to about 10 nm in some embodiments. In certain embodiments, the thickness of each of the first semiconductor layers 120 is in a range from about 3 nm to about 5 nm.

The thicknesses of the third semiconductor layers 128 are in a range from about 3 nm to about 15 nm in some embodiments. In certain embodiments, the thickness of the third semiconductor layers 128 ranges from about 5 nm to about 7 nm.

In some embodiments, the first second semiconductor layer 125 on the substrate is thicker than the upper second semiconductor layers 125. In certain embodiments, the thickness of the first second semiconductor layer 125 ranges from about 50 nm to about 150 nm.

The thicknesses of the second semiconductor layers 125 are in a range from about 3 nm to about 15 nm in some embodiments. In certain embodiments, the thickness of the second semiconductor layers 125 ranges from about 5 nm to about 7 nm.

In certain embodiments, the thickness of the second and third semiconductor layers 125 and 128 are about the same and the thickness of the first semiconductor layer 120 is less than the thickness of the second and third semiconductor layers 125 and 128.

The first, second, and third semiconductor layers 120, 125, and 128 may be formed by CVD, including MOCVD, LPCVD, and PECVD, PVD, MBE, ALD, or other suitable processes.

Figure 25:
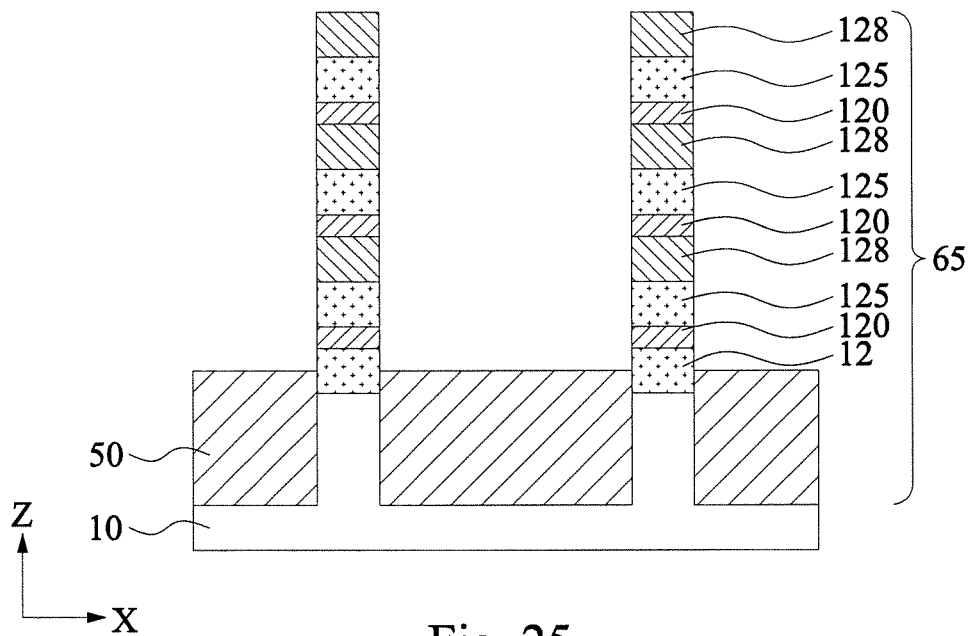
FIG. 25 shows a sequential process performed on the device of FIG. 24 for manufacturing a GAA FET device according to an embodiment of the present disclosure.
Figure 26:
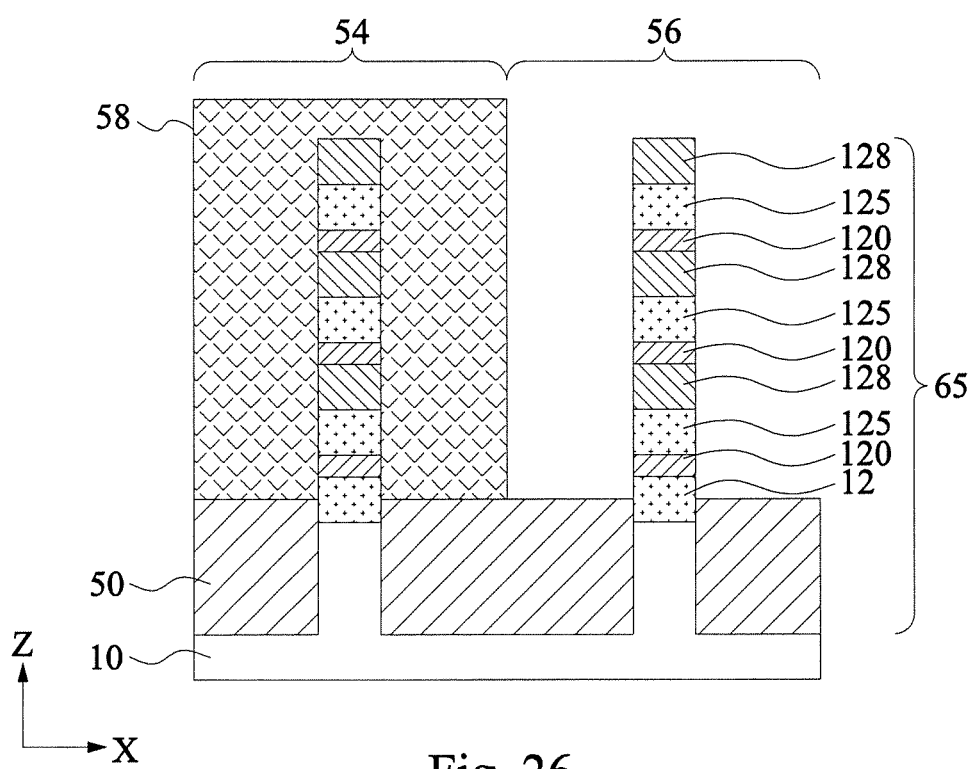
FIG. 26 shows a sequential processes performed on the devices of FIG. 21 and FIG. 25 for manufacturing a GAA FET device according to an embodiment of the present disclosure.

The isolation insulating layer 50 is subsequently recess etched using suitable anisotropic etching techniques to expose the fins 65, as shown in FIG. 25, resulting in a similar structure to FIG. 21. In some embodiments, the strain-relaxed buffer layer 12 is partially exposed from the isolation insulating layer 50.

FIGS. 26-31 show exemplary sequential processes for manufacturing a GAA FET device from the structures of FIGS. 21 and 25. The GAA FET device is a complementary metal oxide (CMOS) device in some embodiments. Embodiments of the CMOS device include a p-type and n-type field effect transistors (pFET and nFET). Adverting to FIG. 26, a first fin mask 58, is formed overlying a first FET region 54 of the semiconductor device, leaving a second FET region 56 exposed. In certain embodiments, the first FET region 54 is a pFET region and the second FET region 56 is an nFET region. The first fin mask 58 can be formed by suitable photolithographic techniques. The first fin mask 58 covers the fin 65 in the first FET region 54.

Figure 27:
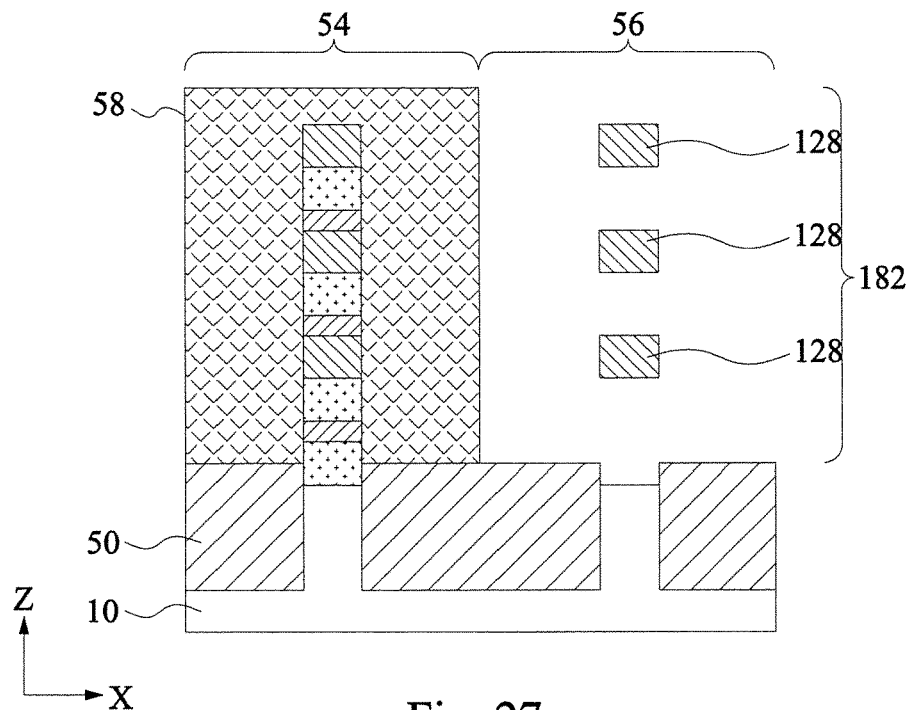
FIG. 27 shows a sequential process performed on the device of FIG. 26 for manufacturing a GAA FET device according to an embodiment of the present disclosure.

While the first FET region 54 is masked, the second FET region 56 is selectively etched to remove the first semiconductor layers 120 and the second semiconductor layers 125 leaving the remaining third semiconductor layers 128 as the second nanowire structure 182 including a plurality of stacked nanowires arranged in the Z direction formed from the third semiconductor layers 128, as shown in FIG. 27.

The first semiconductor layers 120 and second semiconductor layers 125 can be removed by etching using an etchant that selectively etches the first semiconductor layers 120 and second semiconductor layers 125 against the third semiconductor layers 128.

For example, when the first semiconductor layers 120 are formed of Ge, the third semiconductor layers 128 are formed of Si, and the second semiconductor layers 125 are formed of SiGe, the first semiconductor layers 120 and second semiconductor layers 125 can be selectively removed using a thermal etch technique using a gaseous mixture of HCl and $H_2$; a dry etch technique using a plasma, such as $CF_4$; or a wet etch technique such as using, but not limited to, a mixture of hydrofluoric acid (HF), nitric acid ($HNO_3$), and acetic acid ($CH_3COOH$); or a mixture of HF, $CH_3COOH$, and hydrogen peroxide ($H_2O_2$).

Figure 28:
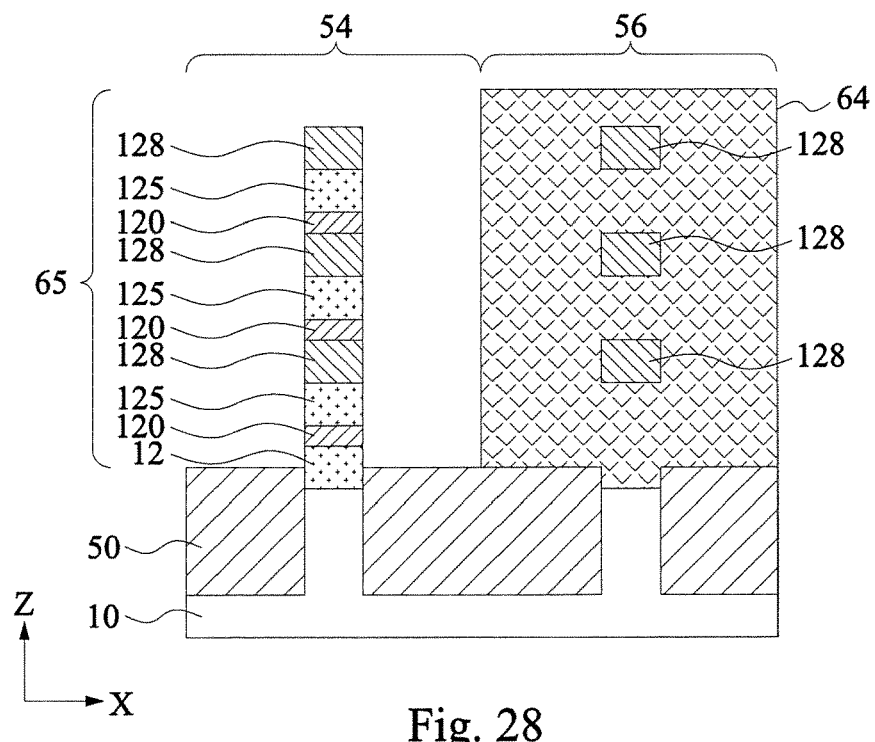
FIG. 28 shows a sequential process performed on the device of FIG. 27 for manufacturing a GAA FET device according to an embodiment of the present disclosure.

Adverting to FIG. 28, the first fin mask 58 is subsequently removed, such as by using a suitable stripping or ashing operation, and a second fin mask 60, is formed overlying the second FET region 56 of the semiconductor device, leaving the first FET region 54 exposed. The second fin mask 60 can be formed by suitable photolithographic techniques. The second fin mask 60 covers the fin 65 in the second FET region 56.

Figure 29:
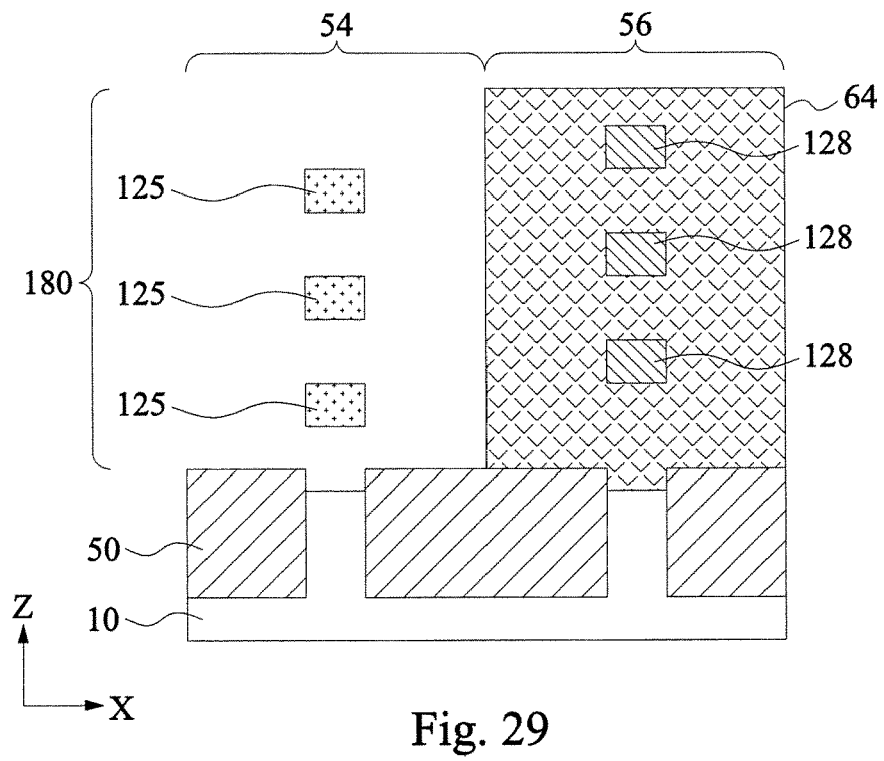
FIG. 29 shows a sequential process performed on the device of FIG. 28 for manufacturing a GAA FET device according to an embodiment of the present disclosure.

While the second FET region 56 is masked, the first FET region 54 is selectively etched to remove the first semiconductor layers 120 and the third semiconductor layers 128 leaving the remaining second semiconductor layers 125 as the first nanowire structure 180 including a plurality of stacked nanowires arranged in the Z direction formed from the second semiconductor layers 125, as shown in FIG. 29. The nanowires 125 extend in the Y direction (into the page as shown in FIG. 29).

The first semiconductor layers 120 and third semiconductor layers 128 can be removed or etched using etchants that selectively etch the first semiconductor layers 120 and third semiconductor layers 128 against the second semiconductor layers 125.

For example, when the first semiconductor layers 120 are formed of Ge, the third semiconductor layers 128 are formed of Si, and the second semiconductor layers 125 are formed of SiGe, the first semiconductor layers 120 and third semiconductor layers 125 can be selectively removed using a two-operation process including a first operation of either dry etching or wet etching the first semiconductor layers 120 in some embodiments. The dry etching operation may be performed using a plasma mixture of $CF_4$, $O_2$, and $N_2$. The wet operation may be performed by etching the first semiconductor layer 120 using an ammonium hydroxide ($NH_4OH$):$H_2O_2$ mixture, or an ozonized ($O_3$) deionized water: $H_2O_2$ based solution. The third semiconductor layers 128 are subsequently removed by selectively etching the third semiconductor layers 128 to the second semiconductor layers 125. The third semiconductor layer 128 is etched by a dry etching process using sulfur hexaflouride ($SF_6$) based gases in some embodiments. In other embodiments, a two-step wet etching operation is performed. The wet etching operation may include a first sub-operation of oxidizing the silicon third semiconductor layer 128 by exposure to $HNO_3$ or hydrogen peroxide ($H_2O_2$) followed by a second sub-operation of removal of the oxidized silicon (e.g. —$SiO_2$) by exposure to an HF solution or a TMAH solution. In other embodiments, the third semiconductor layer 128 is removed by wet etching with a HF:$NH_4OH$ solution.

The second fin mask 60 is subsequently removed, such as by using a suitable stripping or ashing operation.

The first FET nanowires 125 have a height H3 and the second FET nanowires 128 have a height H4. In certain embodiments, the height H3 is about the same as the height H4. Immediately adjacent first FET nanowires 125 are spaced-apart from each other by a distance S3, and immediately adjacent second FET nanowires 128 are spaced-apart from each other by a distance S4.

In some embodiments, the height H3 of the first FET nanowires 125 is not equal to the distance S4 of the spacing between immediately adjacent second FET nanowires 25. In some embodiments, the height H3 of the first FET nanowires 125 is less than the distance S4 of the spacing between immediately adjacent second FET nanowires 128. Likewise, in some embodiments, the height H4 of the second FET nanowires 128 is not equal to distance S3 of the spacing between immediately adjacent first FET nanowires 125. In some embodiments, the height H4 of the second FET nanowires 128 is less than the distance S3 of the spacing between immediately adjacent first FET nanowires 125.

In some embodiments, the distance S3 of the spacing between immediately adjacent first FET nanowires 125 is greater than the height H3 of the first FET nanowires 125. Likewise, in some embodiments, the distance S4 of the spacing between immediately adjacent second FET nanowires 128 is greater than the height H4 of the second FET nanowires 128.

Figure 30:
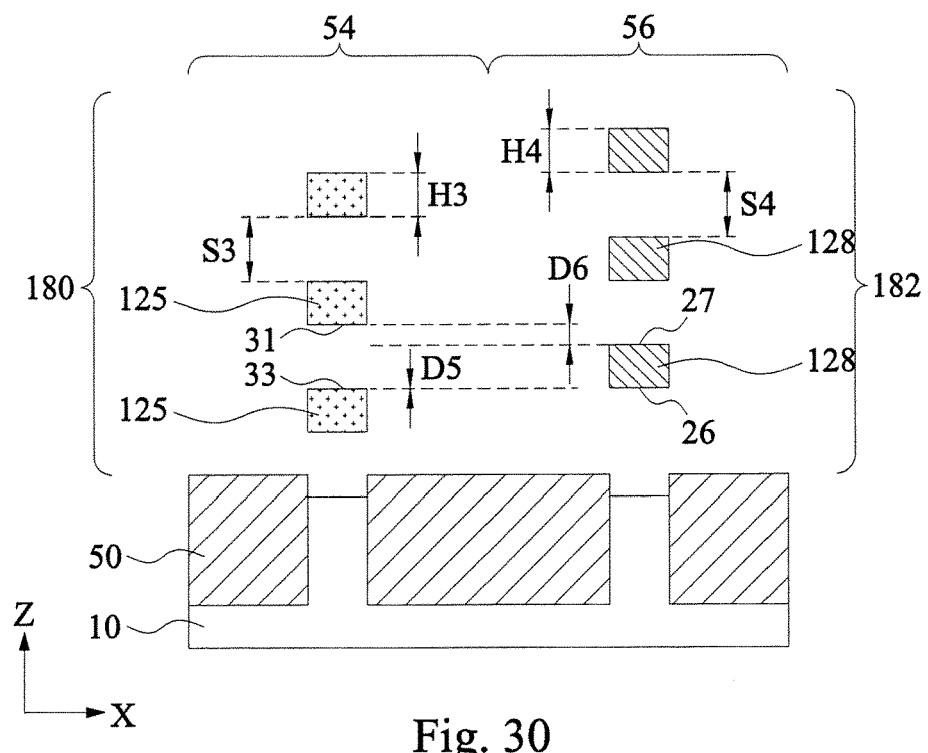
FIG. 30 shows a sequential process performed on the device of FIG. 29 for manufacturing a GAA FET device according to an embodiment of the present disclosure.

In some embodiments, immediately adjacent nanowires in the nanowire structures are spaced-apart by a substantially equal distance. As shown in FIG. 30, the arrangement of the first FET nanowires 125 and the second FET nanowires 128 are staggered along the X-direction, in some embodiments.

In some embodiments, a distance D5 between a top surface 33 in the Z-direction of a first nanowire 125 and a bottom surface 26 in the Z-direction of the closest second nanowire 128 is less than a distance D6 between the top surface 27 in the Z-direction of a second nanowire 128 and a bottom surface 22 in the Z-direction of the closest first nanowire 125. In certain embodiments, top surface 33 of the first nanowire 125 and bottom surface 26 of the second nanowire 128 are substantially at the same height, as shown in FIG. 30. Therefore, the distance D5 between the top surface 33 of the first nanowire 125 and the bottom surface 26 of the second nanowire 128 is substantially zero in certain embodiments.

Figure 31A:
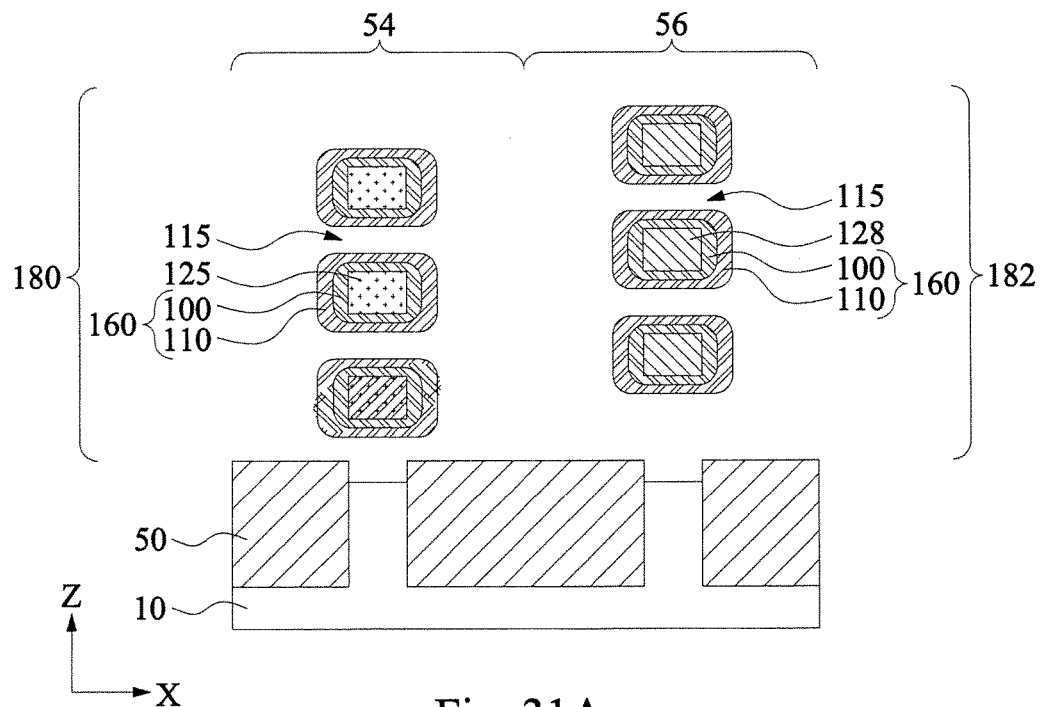
FIG. 31A shows a sequential process performed on the device of FIG. 30 for manufacturing a GAA FET device according to an embodiment of the present disclosure.

A gate electrode structure 160 is subsequently formed around each of the plurality of nanowires 125 and 128. The gate electrode structure is formed around a first portion of the nanowires that is the channel region of the nanowires. The gate electrode structures 160 include a gate dielectric layer 100 formed around each of the nanowires 125 and 128 and gate electrode layers 110 formed on the gate dielectric layers 100, as shown in FIG. 31A, in some embodiments. As shown in FIG. 31A, the gate electrode structures 160 wraps around each nanowire 125 and 128, and the gate electrode structures are spaced-apart from each other by a gap 115 between immediately adjacent nanowires 125 and 128 in each nanowire structure 180 and 182, in some embodiments. Thus, the individual gate electrode structures 160 do not merge in some embodiments.

In certain embodiments, the gate dielectric layer 100 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, or any combination thereof. In some embodiments, the gate dielectric layer 100 includes an interfacial layer (not shown) formed between the nanowires and the dielectric material.

The gate dielectric layer 100 may be formed by CVD, ALD, or any suitable method. In one embodiment, the gate dielectric layer 100 is formed using a highly conformal deposition process such as ALD in order to ensure the formation of a gate dielectric layer having a uniform thickness around each channel layers. The thickness of the gate dielectric layer 100 is in a range from about 1 nm to about 6 nm in one embodiment.

The gate electrode layer 110 is formed on the gate dielectric layer 100 to wrap around each nanowire. The gate electrode layer 110 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, or any combination thereof.

In certain embodiments of the present disclosure, one or more work function adjustment layers (not shown) are interposed between the gate dielectric layer 100 and the gate electrode 110. The work function adjustment layers are made of a conductive material such as a single layer of TiN, TaN, TaAlC, TiC, TaC, Co, Al, TiAl, HfTi, TiSi, TaSi or TiAlC, a multilayer of two or more of these materials, or any combination thereof. For the nFET, one or more of TaN, TaAlC, TiN, TiC, Co, TiAl, HfTi, TiSi and TaSi is used as the work function adjustment layer, and for the pFET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for an N-type FET and a p-type FET which may use different metal layers.

Figure 31B:
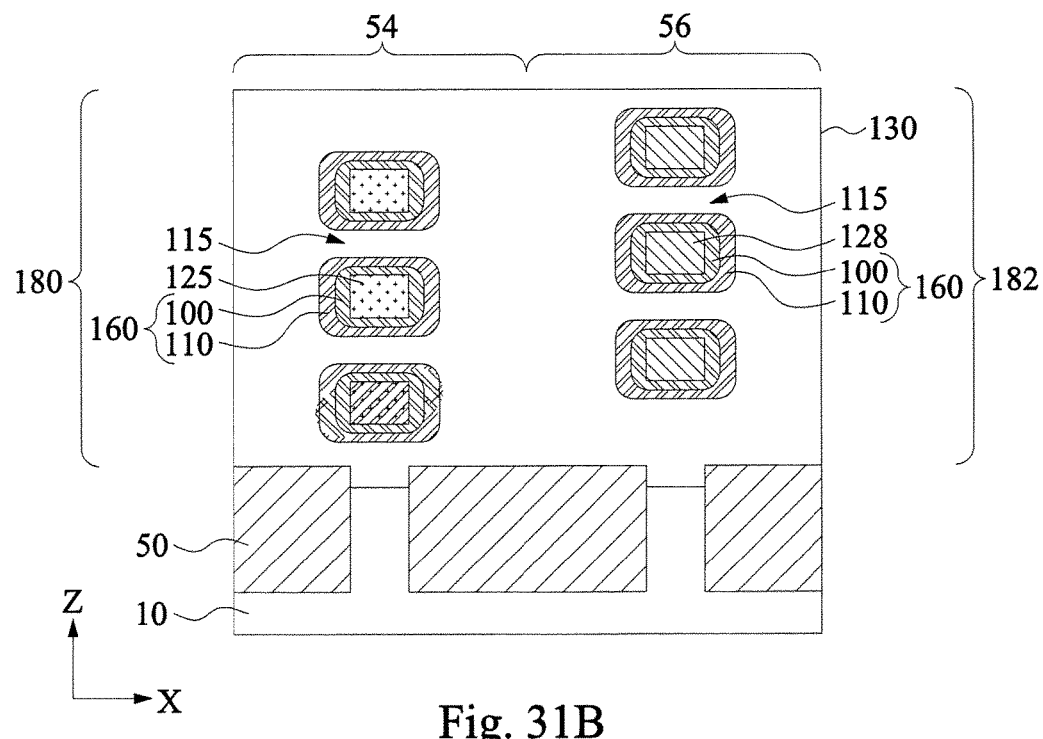
FIG. 31B shows a sequential process performed on the device of FIG. 31A for manufacturing a GAA FET device according to an embodiment of the present disclosure.

A conductive layer 130 is formed in some embodiments to surround the nanowire structures and to fill the gaps 115 between the nanowires, as shown in FIG. 31B. The conductive layer 130 may be formed by any suitable conductive material, such as a metal, including tungsten (W). The conductive material may be deposited by any suitable deposition technique, including CVD, ALD, and electroplating.

Figure 33:
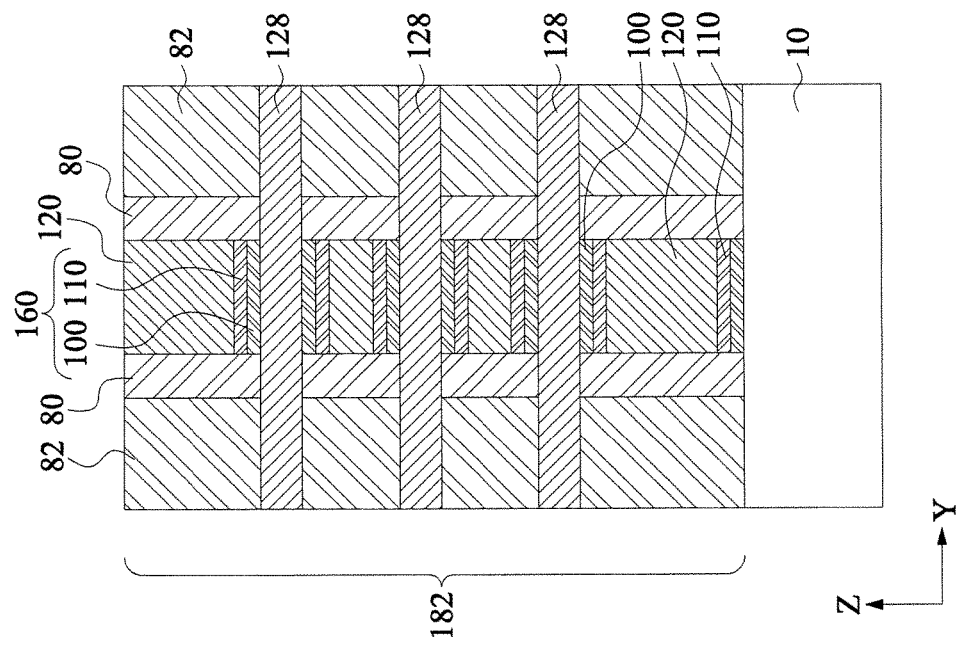
FIG. 33 is a cross section corresponding to line C-C of FIG. 1 and shows a sequential process for manufacturing a GAA FET device according to an embodiment of the present disclosure.
Figure 32:
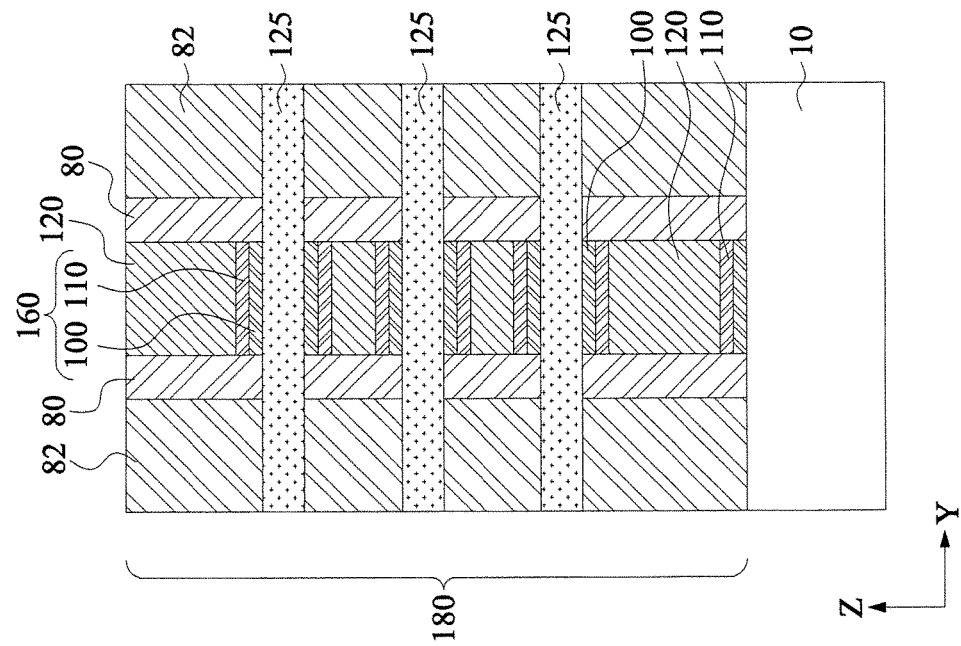
FIG. 32 is a cross section corresponding to line B-B of FIG. 1 and shows a sequential process for manufacturing a GAA FET device according to an embodiment of the present disclosure.

In some embodiments, insulating sidewalls 80 are formed on opposing sides of the gate electrode structure 160 and source/drain regions 82 are formed on second portions of the nanowires on opposing sides of the gate electrode structures 160. The insulating sidewalls 80 are between the gate electrode structures 110 and the source/drain regions 82, as shown in FIGS. 32 and 33. FIG. 32 corresponds to a cross section according to line B-B of FIG. 1 of the first nanowire structure 180 and FIG. 33 corresponds to a cross section according to line C-C of FIG. 1 of the second nanowire structure 182.

In order to support the nanowires during processing, the portions of the nanowire structures 180 and 182 where the source/drain regions 82 are formed may be masked during the removal of either the first and second semiconductor layers 120 and 125 or the first and third semiconductor layers 120 and 128 from the portions of the nanowires where the gate electrode structures 160 are to be formed. After formation of the gate electrode structures 160 and the formation of a conducting layer 120 between the gate electrode structures 160, the portion of the nanowires where the gate electrode structures 160 are formed may be masked, and the respective first and second semiconductor layers 120 and 125 or first and third semiconductor layers 120 and 128 are removed from the portions of the nanowire structures 180 and 182 where the source/drain regions 82 are formed.

Alternatively, in other embodiments dummy gate structures are initially formed on the nanowire structures 180 and 182 and the respective first and second semiconductor layers 120 and 125 or first and third semiconductor layers 120 and 128 are removed from the portions of the nanowire structures 180 and 182 where the source/drain regions 82 are formed. After forming the source and drain regions 82, the source/drain regions 82 are masked, and the dummy gate electrode structures are removed, followed by formation of gate electrode structures 160 according to the present disclosure.

In other embodiments, end regions of the fin structures 45 are masked during the removal of the respective first and second semiconductor layers 120 and 125 or first and third semiconductor layers 120 and 128 so that end portions of the fin structures 45 anchor the nanowires during subsequent processing. After removal of the respective first and second semiconductor layers 120 and 128 or first and third semiconductor layers 120 and 128, the gate electrode structures 160 and source/drain regions 82 are formed. The respective first and second semiconductor layers 120 and 125 or first and third semiconductor layers 120 and 128 in the end portions of the fin structures 45 can be removed after formation of the gate electrode structures 160 and source/drain regions 82.

The present disclosure is not limited to fin structures comprising three stacked nanowires. In certain embodiments, additional nanowires may be included in each nanowire structure 180 and 182.

It is understood that the GAA FETs undergo further CMOS processes to form various features such as contacts/vias, interconnect metal layers, dielectric layers, passivation layers, etc.

Figure 34:
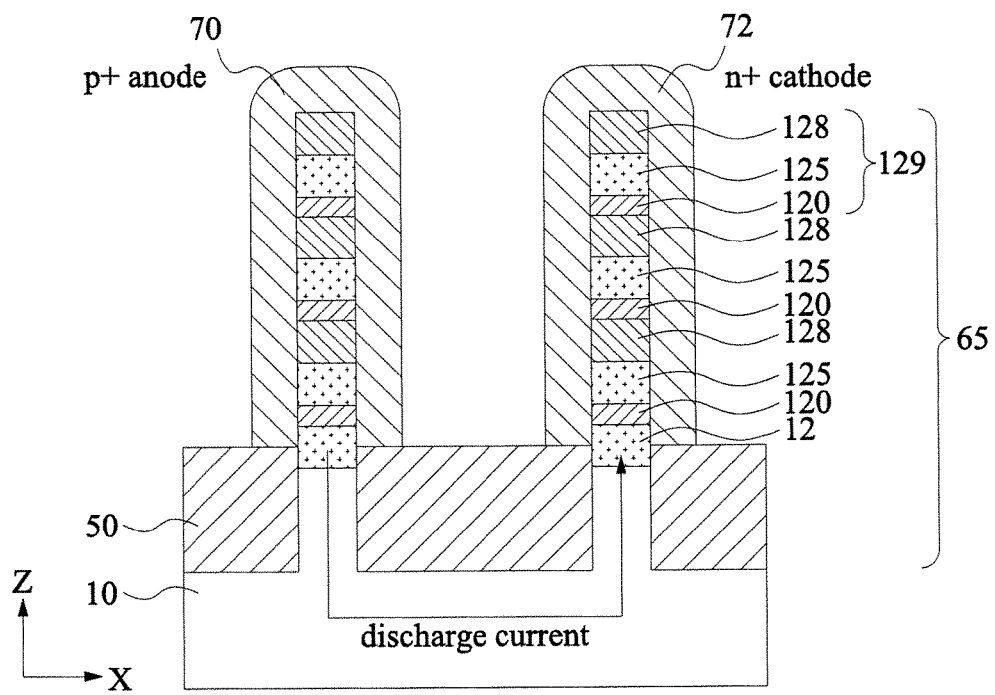
FIG. 34 shows an embodiment of a semiconductor device according to another embodiment of the present disclosure.

In other embodiments of the present disclosure, an electrostatic discharge device can be formed, as shown in FIG. 34. Starting with the structure of FIG. 21 or 25, for example, outer semiconductor layers 70 and 72 are formed surrounding the fins 65 to form a p+ anode and an n+ cathode, respectively, as shown in FIG. 34. The outer semiconductor layers 70 and 72 may comprise any of the semiconductor materials described in the other embodiments disclosed herein. In certain embodiments, the outer semiconductor layer 70 of the p+ anode is a p-doped SiGe or Si, and the outer semiconductor layer 72 of the n+ cathode is an n-doped Si or SiC. The thickness of the outer layers 70 and 72 is from about 10 to about 20 nm in certain embodiments. Electrostatic charge is discharged from the p+ anode to the n+ cathode thereby protecting a semiconductor device from exposure to high voltage and dissipating heat.

Figure 35:
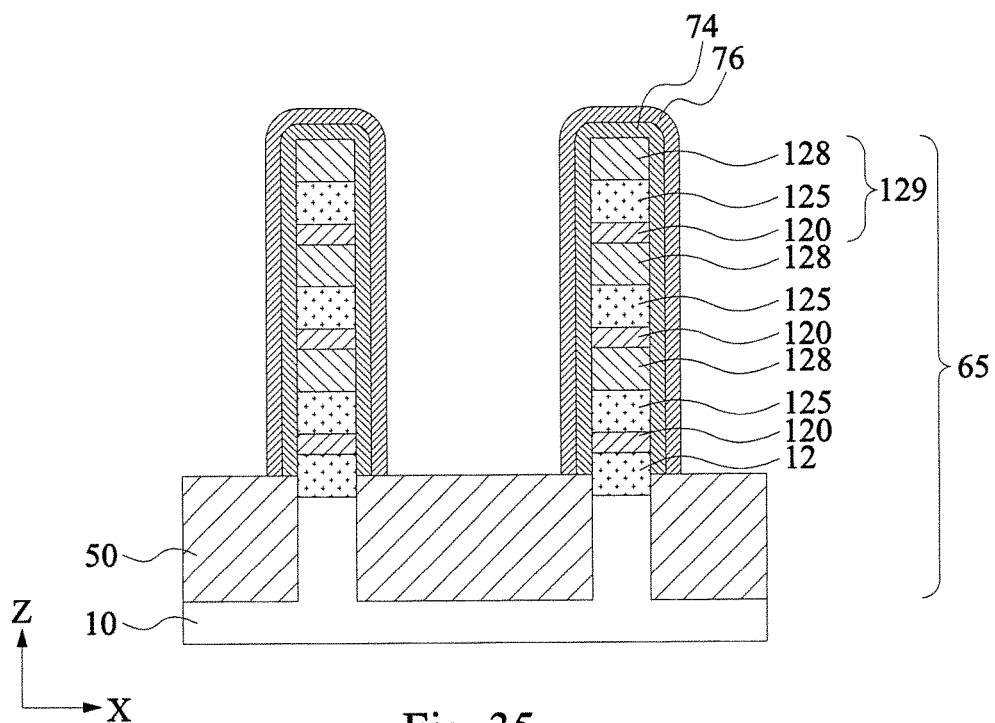
FIG. 35 shows an embodiment of a semiconductor device according to another embodiment of the present disclosure.

In another embodiment of the present disclosure, input/output devices are formed, as shown in FIG. 35. Starting with the structure of FIG. 21 or 25, for example, a dielectric layer 74, and a conductive layer 76 are formed surrounding the fins 65 to form input/output gate terminals, as shown in FIG. 35. In certain embodiments, the dielectric layer 74 is formed from the same materials as the gate dielectric layer 100 in the other embodiments disclosed herein but is thicker in order to withstand higher voltages than the nanowire structures, disclosed herein. In certain embodiments, the dielectric layer 74 ranges from about 6 nm to about 25 nm in thickness. In certain embodiments, the conductive layer 76 is formed from the same materials as the gate electrode layer 110 in the other embodiments disclosed herein.

The present disclosure provides horizontal gate-all-around (HGAA) CMOS devices with different n- and p-channel materials. The present disclosure provides HGAA CMOS devices with improved stacking density of nanowires. The staggered arrangement of adjacent nFET and pFET nanowire structures provides high stacking density with improved short-channel effect control. The staggered arrangement and increased spacing between immediately adjacent nanowires prevents merging of the gate electrode structures wrapping around immediately adjacent nanowires.

It will be understood that not all advantages have been necessarily discussed herein, no particular advantage is required for all embodiments or examples, and other embodiments or examples may offer different advantages.

An embodiment of the present disclosure is a semiconductor device including a first nanowire structure disposed on a semiconductor substrate and extending in a first direction on the semiconductor substrate. The first nanowire structure includes a plurality of first nanowires including a first nanowire material extending along the first direction and arranged in a second direction, the second direction being substantially perpendicular to the first direction. A second nanowire structure is disposed on the semiconductor substrate and extends in the first direction on the semiconductor substrate. The second nanowire structure includes a plurality of second nanowires including a second nanowire material extending along the first direction and arranged in the second direction. The second nanowire material is not the same as the first nanowire material. Each nanowire is spaced-apart from an immediately adjacent nanowire. First gate structures wrap around the first nanowires at a first region of the first nanowire structure, and second gate structures wrap around the second nanowires at a first region of the second nanowire structure. The first and second gate structures include gate electrodes. When viewed in a cross section taken along a third direction substantially perpendicular to the first and second directions a height of the first nanowires along the second direction is not equal to a distance of a spacing along the second direction between immediately adjacent second nanowires.

Another embodiment of the present disclosure is a method of manufacturing a semiconductor device. The method includes forming a stacked structure of a plurality of first semiconductor layers, a plurality of second semiconductor layers, and a plurality of third semiconductor layers alternately stacked in a first direction over a substrate. The stacked structure is patterned into a first fin structure and a second fin structure extending along a second direction substantially perpendicular to the second direction. A portion of the second and third semiconductor layers is removed between adjacent first semiconductor layers of the first fin structure to form a first nanowire structure. A portion of the first and third semiconductor layers between adjacent second semiconductor layers of the second fin structure is removed to form a second nanowire structure. First gate structures are formed wrapping around first nanowires of the first nanowire structure at a first region of the first nanowires, and second gate structures are formed wrapping around second nanowires of the second nanowire structure at a first region of the second nanowires. The first and second gate structures include gate electrodes. When viewed in a cross section taken along a third direction substantially perpendicular to the first direction and the second direction a height of the first nanowires along the first direction is not equal to a distance of a spacing along the first direction between immediately adjacent second nanowires.

Another embodiment of the present disclosure is a method of manufacturing a semiconductor device. The method includes forming a first dummy fin structure and a second dummy fin structure extending along a first direction on a semiconductor substrate. The first dummy fin structure and second dummy fin structure includes a first semiconductor material. A first insulating layer is formed over the first dummy fin structure and the second dummy fin structure. The first dummy fin structure and the second dummy fin structure are etched to recess the first dummy fin structure and the second dummy fin structure in the first insulating layer. A second semiconductor material, a third semiconductor material, and the first semiconductor material, are alternately deposited in this order, to form a first fin structure and a second fin structure including a stack of alternating first semiconductor layers, second semiconductor layers, and third semiconductor layers alternately stacked in a second direction over a substrate, wherein the second direction is substantially perpendicular to the first direction. The first insulating layer is etched so that the first fin structure and the second fin structure project from the first insulating layer. A portion of the second and third semiconductor layers between adjacent first semiconductor layers of the first fin structure is removed to form a first nanowire structure including a plurality of spaced-apart first nanowires. A portion of the first and third semiconductor layers between adjacent second semiconductor layers of the second fin structure is removed to form a second nanowire structure including a plurality of spaced-apart second nanowires. First gate structures are formed wrapping around first nanowires of the first nanowire structure at a first region of the first nanowires. Second gate structures are formed wrapping around second nanowires of the second nanowire structure at a first region of the second nanowires. The first and second gate structures include gate electrodes. When viewed in a cross section taken along a third direction substantially perpendicular to the first and second directions a height of the first nanowires along the second direction is not equal to a distance of a spacing along the second direction between immediately adjacent second nanowires.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a stacked structure of a plurality of first semiconductor layers, a plurality of second semiconductor layers, and a plurality of third semiconductor layers alternately stacked in a first direction over a substrate, wherein the first, second and third semiconductor layers are made froth different materials;
    patterning the stacked structure into a first fin structure and a second fin structure extending along a second direction substantially perpendicular to the first direction;
    removing a portion of the second and third semiconductor layers between adjacent first semiconductor layers of the first fin structure to form a first nanowire structure;
    removing a portion of the first and third semiconductor layers between adjacent second semiconductor layers of the second fin structure to form a second nanowire structure;
    forming first gate structures wrapping around first nanowires of the first nanowire structure at a first region of the first nanowires; and
    forming second gate structures wrapping around second nanowires of the second nanowire structure at a first region of the second nanowires,
    wherein the first and second gate structures include gate electrodes, and
    wherein when viewed in a cross section taken along a third direction substantially perpendicular to the first direction and the second direction a height of the first nanowires along the first direction is not equal to a distance of a spacing along the first direction between immediately adjacent second nanowires.

2. The method according to claim 1, further comprising:
    forming a first mask over the first fin structure prior to removing the portion of the first and third semiconductor layers between adjacent second semiconductor layers of the second fin structure.

3. The method according to claim 2, further comprising:
    forming a second mask over the second fin structure prior to removing the portion of the second and third semiconductor layers between adjacent first semiconductor layers of the first fin structure.

4. The method according to claim 1, further comprising forming source/drain regions disposed over second regions of the first and second nanowires, the second regions of the first and second nanowires being located on opposing sides of the first and second gate structures.

5. The method according to claim 1, wherein the first semiconductor material is Ge, the second semiconductor material is Si, and the third semiconductor material is SiGe.

6. The method according to claim 1, wherein the height of the first nanowires along the first direction is less than the distance of the spacing along the first direction between immediately adjacent second nanowires.

7. The method according to claim 1, wherein a thickness along the first direction of the first and second semiconductor layers is in a range from 3 nm to 15 nm, and a thickness of the third semiconductor layer is in a range from 2 nm to 10 nm.

8. A method of manufacturing a semiconductor device, comprising:
    forming a first dummy fin structure and a second dummy fin structure extending along a first direction on a semiconductor substrate, wherein the first dummy fin structure and second dummy fin structure comprise a first semiconductor material;
    forming a first insulating layer over the first dummy fin structure and the second dummy fin structure;
    etching the first dummy fin structure and the second dummy fin structure to recess the first dummy fin structure and the second dummy fin structure in the first insulating layer;
    alternately depositing a second semiconductor material, a third semiconductor material, and the first semiconductor material, in this order, to form a first fin structure and a second fin structure comprising a stack of alternating first semiconductor layers, second semiconductor layers, and third semiconductor layers alternately stacked in a second direction over a substrate, wherein the second direction is substantially perpendicular to the first direction;
    etching the first insulating layer so that the first fin structure and the second fin structure project from the first insulating layer;
    removing a portion of the second and third semiconductor layers between adjacent first semiconductor layers of the first fin structure to form a first nanowire structure comprising a plurality of spaced-apart first nanowires;
    removing a portion of the first and third semiconductor layers between adjacent second semiconductor layers of the second fin structure to form a second nanowire structure comprising a plurality of spaced-apart second nanowires;
    forming first gate structures wrapping around first nanowires of the first nanowire structure at a first region of the first nanowires; and
    forming second gate structures wrapping around second nanowires of the second nanowire structure at a first region of the second nanowires,
    wherein the first and second gate structures include gate electrodes, and
    wherein when viewed in a cross section taken along a third direction substantially perpendicular to the first and second directions a height of the first nanowires along the second direction is not equal to a distance of a spacing along the second direction between immediately adjacent second nanowires.

9. The method according to claim 8, comprising performing the alternately depositing a second semiconductor material, a third semiconductor material, and the first semiconductor material a total of two to ten times.

10. The method according to claim 8, further comprising forming source/drain regions over a second portion of the first and second nanowires located on opposing sides of the first and second gate structures so that the source/drain regions wrap around the first and second nanowires.

11. The method according to claim 8, wherein the height of the first nanowires along the second direction is less than the distance of the spacing along the second direction between immediately adjacent second nanowires.

12. The method according to claim 11, wherein the height of the first nanowires along the second direction is about the same as a height of the second nanowires along the second direction.

13. The method according to claim 8, wherein the first semiconductor material is Ge, the second semiconductor material is Si, and the third semiconductor material is SiGe.

14. The method according to claim 8, wherein a thickness along the first direction of the first and second semiconductor layers are in a range from 3 nm to 15 nm, and a thickness of the third semiconductor layer is in a range from 2 nm to 10 nm.

15. A method of manufacturing a semiconductor device, comprising:
    forming first and second fin structures, each fin structure comprising a stack of a plurality of first semiconductor layers, a plurality of second semiconductor layers, and a plurality of third semiconductor layers alternately stacked in a first direction over a substrate, wherein the first, second and third semiconductor layers are made from different materials;
    forming a first mask over the first fin structure;
    removing a portion of the first and third semiconductor layers between adjacent second semiconductor layers of the second fin structure to form first nanowires;
    forming a second mask over the second fin structure; and
    removing a portion of the second and third semiconductor layers between adjacent first semiconductor layers of the first fin structure to form second nanowires,
    wherein a height of the first nanowires along the first direction is less than a distance of a spacing along the first direction between immediately adjacent second nanowires.

16. The method according to claim 15, further comprising:
    forming first gate structures wrapping around the first nanowires at a first region of the first nanowires;
    forming second gate structures wrapping around the second nanowires at a first region of the second nanowires; and
    forming source/drain regions disposed over second regions of the first and second nanowires, the second regions of the first and second nanowires being located on opposing sides of the first and second gate structures.

17. The method according to claim 15, wherein a thickness along the first direction of the first and second semiconductor layers is in a range from 3 nm to 15 nm, and a thickness of the third semiconductor layer is in a range from 2 nm to 10 nm.

18. The method according to claim 15, wherein the first semiconductor layer is formed of Ge, the second semiconductor layer is formed of Si, and the third semiconductor layer is formed of SiGe.

19. The method according to claim 15, the first semiconductor layer is $Si_{1-y}Ge_y$, the second semiconductor layer is $Si_{1-z}Ge_z$, and the third semiconductor layer is $Si_{1-x}Ge_x$, where $0<z<x<y<1$, where $0.2 \leq x \leq 0.8$.

20. The method according to claim 15, wherein the first and second semiconductor layers have a same thickness in the first direction and a thickness of the third semiconductor layer in the first direction is less that the thickness of the first and second semiconductor layers.

* * * * *